(12) United States Patent
Akiyoshi

(10) Patent No.: US 10,573,459 B2
(45) Date of Patent: Feb. 25, 2020

(54) MULTILAYER CERAMIC ELECTRONIC COMPONENT AND MOUNTING STRUCTURE THEREOF

(71) Applicant: Murata Manufacturing Co., Ltd., Nagaokakyo-shi, Kyoto-fu (JP)

(72) Inventor: Teppei Akiyoshi, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 94 days.

(21) Appl. No.: 16/016,909

(22) Filed: Jun. 25, 2018

(65) Prior Publication Data

US 2018/0374642 A1    Dec. 27, 2018

(30) Foreign Application Priority Data

Jun. 27, 2017    (JP) ................. 2017-125652

(51) Int. Cl.
| | |
|---|---|
| H01G 2/06 | (2006.01) |
| H01G 4/30 | (2006.01) |
| H01G 4/12 | (2006.01) |
| H01G 4/232 | (2006.01) |

(52) U.S. Cl.
CPC .............. *H01G 2/06* (2013.01); *H01G 4/12* (2013.01); *H01G 4/2325* (2013.01); *H01G 4/30* (2013.01); *H05K 2201/10015* (2013.01); *H05K 2201/10946* (2013.01)

(58) Field of Classification Search
CPC ...... H01G 4/228; H01G 4/232; H01G 4/2325; H01G 4/30; H01G 4/12; H01G 2/06
See application file for complete search history.

(56) References Cited

U.S. PATENT DOCUMENTS

2014/0339955 A1* 11/2014 Tseng ............... H01G 4/252
                                            310/311

FOREIGN PATENT DOCUMENTS

| JP | 05-029108 U | 4/1993 |
|---|---|---|
| JP | 09-205275 A | 8/1997 |
| JP | 11-191472 A | 7/1999 |
| JP | 2001-189232 A | 7/2001 |
| JP | 2011091335 A * | 5/2011 |
| JP | 2011096898 A * | 5/2011 |
| JP | 2013-212524 A | 10/2013 |

* cited by examiner

*Primary Examiner* — Eric W Thomas
(74) *Attorney, Agent, or Firm* — Keating & Bennett, LLP

(57) ABSTRACT

A multilayer ceramic electronic component includes a first metal terminal including a first terminal joining portion connected to a first end surface, first and second extending portions extending from both ends of the first terminal joining portion toward a mounting surface, and first and second mounting portions connected respectively to the first and second extending portions in a length direction connecting the end surfaces to each other. A second metal terminal includes a second terminal joining portion connected to the second end surface, a third extending portion extending from the second terminal joining portion toward the mounting surface, and a third mounting portion connected to the third extending portion and extending in a length direction connecting the end surfaces to each other. The first and second mounting portions include first, second, and third protrusion bending portions protruding toward the mounting surface.

19 Claims, 14 Drawing Sheets

III-III CROSS-SECTIONAL VIEW

IV-IV CROSS-SECTIONAL VIEW

MULTILAYER CERAMIC ELECTRONIC COMPONENT AND MOUNTING STRUCTURE THEREOF

CROSS REFERENCE TO RELATED APPLICATIONS

This application claims the benefit of priority to Japanese Patent Application No. 2017-125652 filed on Jun. 27, 2017. The entire contents of this application are hereby incorporated herein by reference.

BACKGROUND OF THE INVENTION

1. Field of the Invention

The present invention relates to a multilayer ceramic electronic component including, for example, a multilayer ceramic capacitor and a mounting structure thereof.

2. Description of the Related Art

In recent years, multilayer ceramic capacitors, which are chip type electronic components formed of ceramics, have been generally used. In the case in which the multilayer ceramic capacitor is directly solder-mounted to a mounting substrate, the mounting substrate and an electronic component body expand or contract based on the respective thermal expansion coefficients when a temperature change occurs. However, a difference between the thermal expansion coefficients of the two causes stress which causes, for example, damage to the electronic component body or destruction of a joint portion.

When the mounting substrate is easily bent, such as a thin glass epoxy substrate, the same stress may be generated when the mounting substrate is bent.

Further, the same stress may be generated by bending and deforming the substrate when a force is applied to the mounting substrate itself.

When these stresses are applied to the multilayer ceramic capacitor, cracks may occur in the multilayer ceramic capacitor. In order to solve this problem, it has been suggested to solder a metal terminal to a mounting substrate while attaching a metal terminal member formed of a metal plate to an external electrode of a multilayer ceramic capacitor and keeping an electronic component body floating and spaced away from the mounting substrate (See Japanese Patent Application Laid-Open No. 2001-189232).

According to such a method, heat at the time of soldering is transmitted to the electronic component body through the metal terminal, so that thermal shock is able to be made less likely to be applied to the electronic component body. Even if stress caused by temperature change or deformation of the mounting substrate occurs, the electronic component body can advantageously absorb the stress and deformation by elastic deformation of the metal terminal.

In addition to soldering, welding (for example, laser welding as a construction method capable of shortening welding time) is known as a method of mounting a connection terminal at a mounting point (see Japanese Patent Application Laid-Open No. H11-191472).

However, in the case of mounting an electronic component with a metal terminal as described in Japanese Patent Application Laid-Open No. 2001-189232 on a mounting substrate by soldering to a device (vehicle-mounted device) used in a high-temperature environment, a component is likely to detach or drop from the mounting substrate due to melting of solder joining the metal terminal and the mounting substrate, or if the solder is exposed to a high temperature for a long period of time at a temperature at which the solder does not melt, the solder is weakened, so that there may occur problems such as an increase in equivalent series resistance (ESR) and decrease in fixing strength due to formation of solder cracks. To avoid this, it is generally conceivable to use a solder having a higher melting point. However, there is no satisfactory solder at present due to price, mountability and performance requirements that is capable of solving the above problem.

In the general welding and mounting technique as disclosed in Japanese Patent Application Laid-Open No. H11-191472, it is necessary to melt and connect the metal by holding down the metal to be connected against a portion to be welded and energizing the metal with reliable surface contact. If this technique is applied to an electronic component with a metal terminal as disclosed in Japanese Patent Application Laid-Open No. 2001-189232, it is necessary to securely bring a connection terminal member of the metal terminal member to be mounted into surface contact with a mounting surface of a mounting substrate, and thus, there is a problem that it takes time for connection.

Also in the case of laser welding as disclosed in Japanese Patent Application Laid-Open No. H11-191472, when this technique is applied to the electronic component with a metal terminal as disclosed in Japanese Patent Application Laid-Open No. 12001-189232, it is an essential condition that the connection terminal member of the metal terminal member to be mounted is securely in surface contact with the mounting surface of the mounting substrate. At this time, it is difficult to achieve a condition in which a portion to be welded is securely in contact due to problems of warpage of the mounting substrate and coplanarity of the electronic component (flatness of components (in the case of metal terminals, deviation of mounting surfaces of right and left metal terminals)), and this may be a cause of poor welding.

In addition, there is a problem in that since the metallic terminal member having metallic luster reflects laser energy, efficient welding cannot be performed.

Although a method of conducting laser welding while holding down electronic components by another method is conceivable, it is impossible to make full use of the speed of laser welding obtained without contact.

SUMMARY OF THE INVENTION

Preferred embodiments of the present invention provide multilayer ceramic electronic components each including a metal terminal able to be reliably welded and mounted even if a mounting substrate warps, a connection portion is not disposed in a single plane due to a step difference, or coplanarity on the electronic component side is low, and mounting structures thereof.

A multilayer ceramic electronic component according to a preferred embodiment of the present invention includes a laminate including a plurality of ceramic layers and a plurality of internal electrode layers, which are alternately stacked, a first main surface and a second main surface facing each other in a stacking direction, a first side surface and a second side surface facing each other in a width direction orthogonal or substantially orthogonal to the stacking direction, and a first end surface and a second end surface facing each other in a length direction orthogonal or substantially orthogonal to the stacking direction and the width direction, an electronic component body including a first external electrode connected to the first end surface of the laminate and a second external electrode connected to the second end surface of the laminate, a first metal terminal connected to the first external electrode, and a second metal terminal connected to the second external electrode. In this multilayer ceramic electronic component, the second main surface of the laminate is located on a side of a mounting surface of a mounting substrate on which the multilayer ceramic electronic component is to be mounted. The first metal terminal includes a first terminal joining portion which is defined by a lead wire, extends in a width direction connecting the first side surface and the second side surface, and is connected to the first end surface, a first extending portion and a second extending portion which extend from both ends of the first terminal joining portion and extend toward the mounting surface such that a gap is provided between the second main surface of the multilayer ceramic electronic component and the mounting surface of the mounting substrate, a first mounting portion which is connected to the first extending portion and extends in a length direction connecting the first end surface and the second end surface, and a second mounting portion which is connected to the second extending portion and extends in the length direction connecting the first end surface and the second end surface. The second metal terminal includes a second terminal joining portion which is defined by a lead wire and connected to the second end surface, a third extending portion which is connected to the second terminal joining portion and extends toward the mounting surface such that a gap is provided between the second main surface of the multilayer ceramic electronic component and the mounting surface of the mounting substrate, and a third mounting portion which is connected to the third extending portion and extends in the length direction connecting the first end surface and the second end surface. The first mounting portion includes a first protrusion bending portion protruding toward the mounting surface of the mounting substrate, the second mounting portion includes a second protrusion bending portion protruding toward the mounting surface of the mounting substrate, the third mounting portion includes a third protrusion bending portion protruding toward the mounting surface of the mounting substrate, and respective apexes of the first, second, and third protrusion bending portions are disposed to be in contact with the mounting surface of the mounting substrate.

In a multilayer ceramic electronic component according to a preferred embodiment of the present invention, a height of the first, second, and third protrusion bending portions is preferably not less than about 0.1 mm and not more than about 1 mm.

Furthermore, in a multilayer ceramic electronic component according to a preferred embodiment of the present invention, it is preferable that surfaces of the first and second metal terminals include a black color or an oxidized coating.

A mounting structure of a multilayer ceramic electronic component according to a preferred embodiment of the present invention includes a laminate including a plurality of ceramic layers and a plurality of internal electrode layers, which are alternately stacked, a first main surface and a second main surface facing each other in a stacking direction, a first side surface and a second side surface facing each other in a width direction orthogonal or substantially orthogonal to the stacking direction, and a first end surface and a second end surface facing each other in a length direction orthogonal or substantially orthogonal to the stacking direction and the width direction, an electronic component body including a first external electrode connected to the first end surface of the laminate and a second external electrode connected to the second end surface of the laminate, a first metal terminal connected to the first external electrode, and a second metal terminal connected to the second external electrode. In this mounting structure, the second main surface of the laminate is located on a side of a mounting surface of a mounting substrate on which the multilayer ceramic electronic component is mounted, the first metal terminal includes a first terminal joining portion which is defined by a lead wire, extends in a width direction connecting the first side surface and the second side surface, and is connected to the first end surface, a first extending portion and a second extending portion which extend from both ends of the first terminal joining portion and extend toward the mounting surface such that a gap is provided between the second main surface of the multilayer ceramic electronic component and the mounting surface of the mounting substrate, a first mounting portion which is connected to the first extending portion and extends in a length direction connecting the first end surface and the second end surface, and a second mounting portion which is connected to the second extending portion and extends in the length direction connecting the first end surface and the second end surface. The second metal terminal includes a second terminal joining portion which is defined by a lead wire and connected to the second end surface, a third extending portion which is connected to the second terminal joining portion and extends toward the mounting surface such that a gap is provided between the second main surface of the multilayer ceramic electronic component and the mounting surface of the mounting substrate, and a third mounting portion which is connected to the third extending portion and extends in the length direction connecting the first end surface and the second end surface. The first mounting portion includes a first protrusion bending portion protruding toward the mounting surface of the mounting substrate, the second mounting portion includes a second protrusion bending portion protruding toward the mounting surface of the mounting substrate, and the third mounting portion includes a third protrusion bending portion protruding toward the mounting surface of the mounting substrate, and respective apexes of the first, second, and third protrusion bending portions are joined to the mounting surface of the mounting substrate. Further, in this mounting structure, the multilayer ceramic electronic component is joined to the mounting surface of the mounting substrate by welding from a first recess bending portion on the opposite side to the mounting surface of the mounting substrate at the position of the first protrusion bending portion, joined to the mounting surface of the mounting substrate by welding from a second recess bending portion on the opposite side to the mounting surface of the mounting substrate at the position of the second protrusion bending portion, and joined to the mounting surface of the mounting substrate by welding from a third recess bending portion on the opposite side to the mounting surface of the mounting substrate at the position of the third protrusion bending portion.

Further, in a mounting structure of a multilayer ceramic electronic component according to a preferred embodiment of the present invention, in the joining by welding, it is preferable that the first, second, and third recess bending portions be irradiated with laser, so that the multilayer ceramic electronic component is joined by laser welding.

According to preferred embodiments of the present invention, it is possible to obtain multilayer ceramic electronic components each with a metal terminal which is able to be reliably welded and mounted even if a mounting substrate warps, a connection portion is not disposed in a single plane due to a step difference, or coplanarity on the electronic component side is low, and mounting structures thereof.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
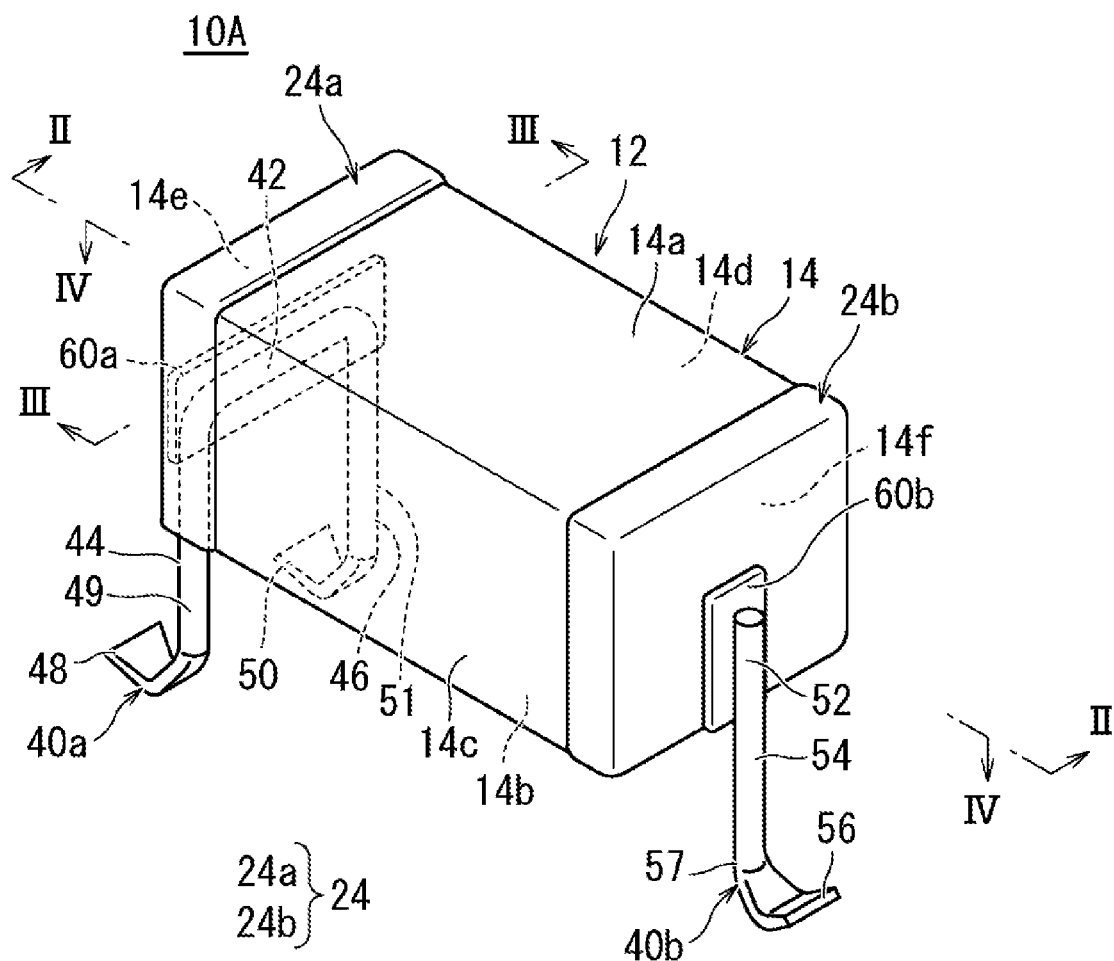
FIG. 1 is an external perspective view showing an example of a multilayer ceramic electronic component according to a first preferred embodiment of the present invention.
Figure 2:
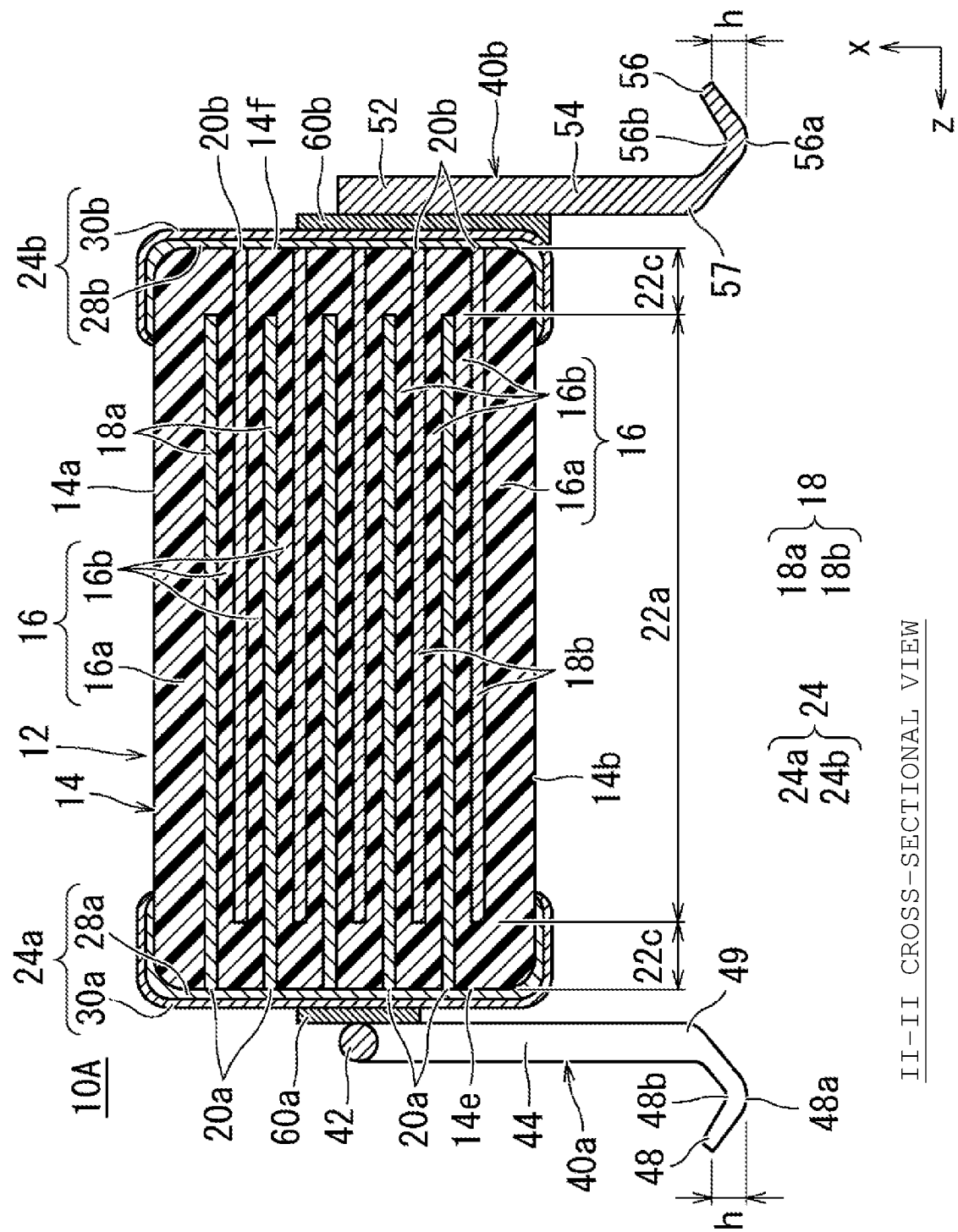
FIG. 2 is a cross-sectional view taken along line II-II of FIG. 1 showing the multilayer ceramic electronic component according to the first preferred embodiment of the present invention.
Figure 3:
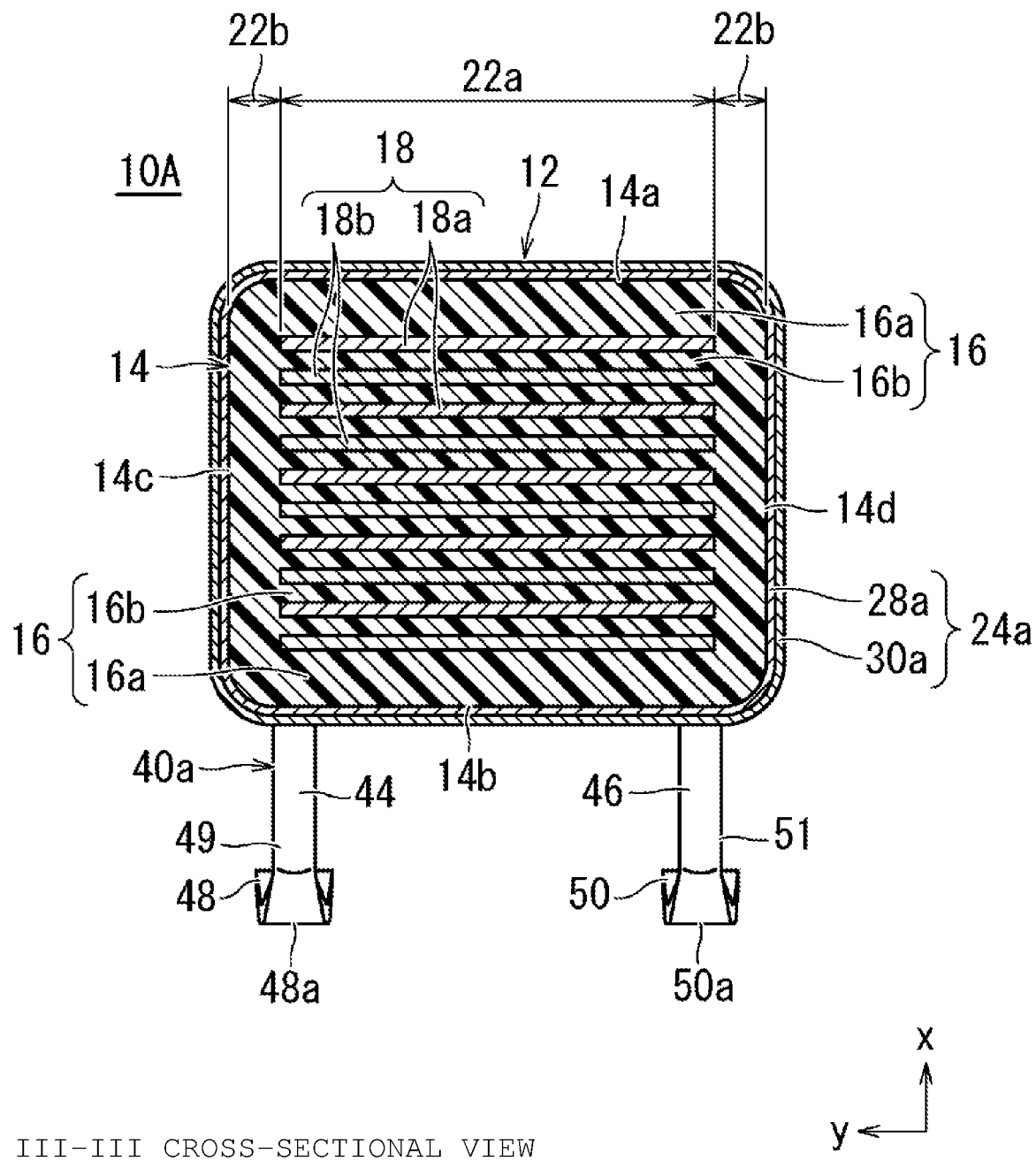
FIG. 3 is a cross-sectional view taken along line III-III of FIG. 1 showing the multilayer ceramic electronic component according to the first preferred embodiment of the present invention.
Figure 4:
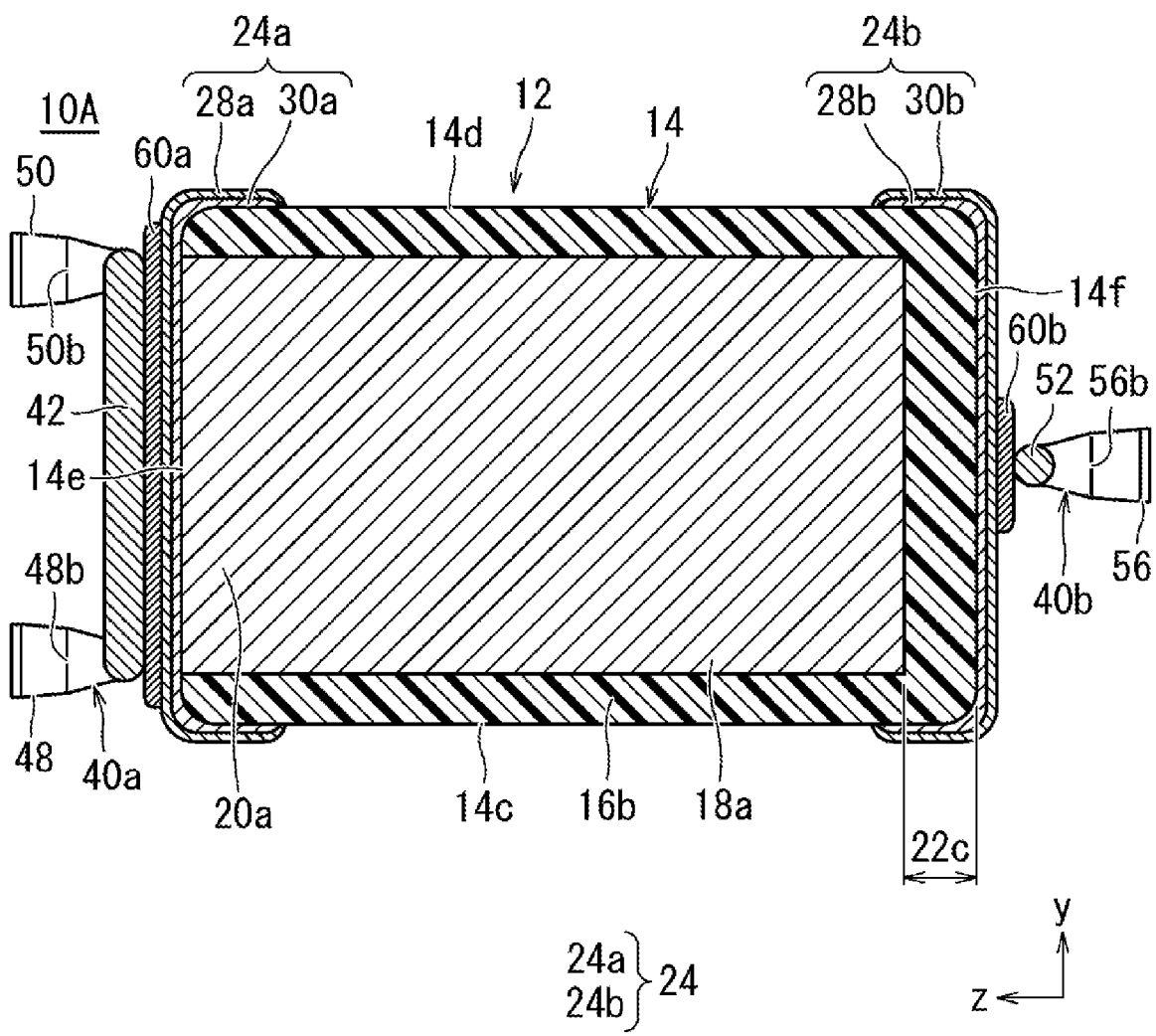
FIG. 4 is a cross-sectional view taken along line IV-IV of FIG. 1 showing the multilayer ceramic electronic component according to the first preferred embodiment of the present invention.
Figure 5:
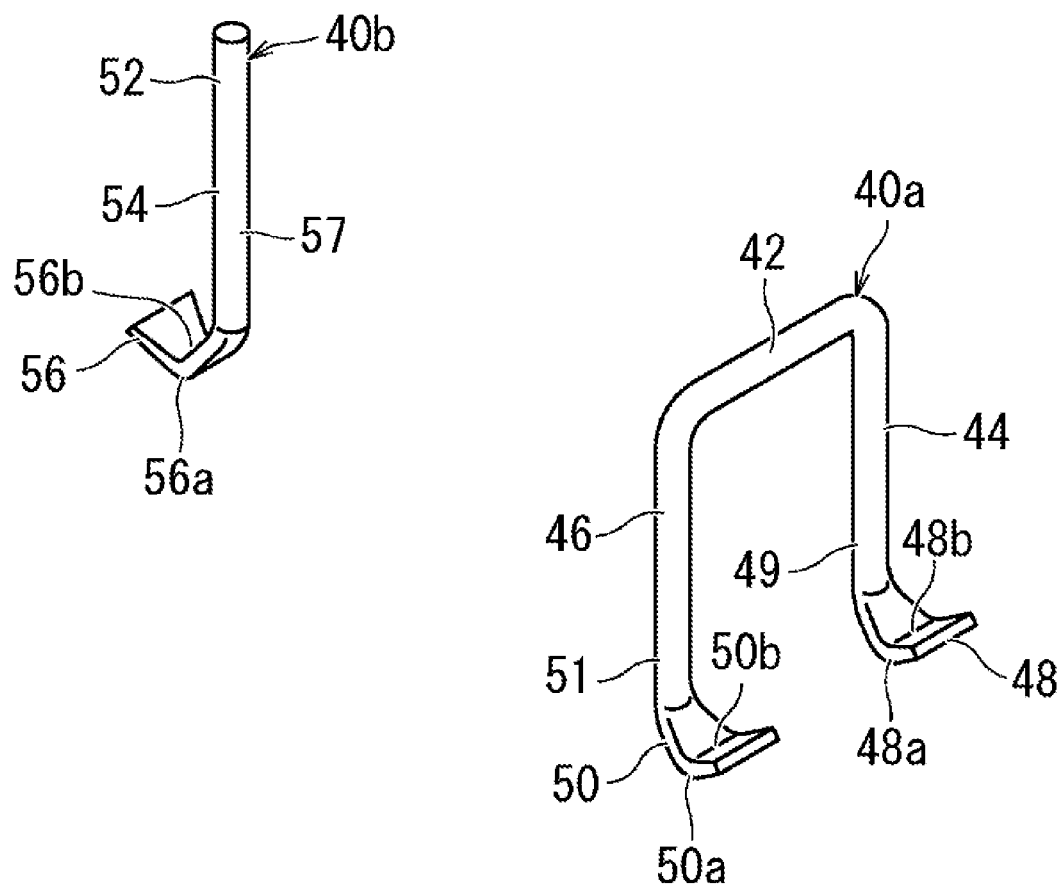
FIG. 5 is an external perspective view showing a metal terminal included in the multilayer ceramic electronic component according to the first preferred embodiment of the present invention.
Figure 6:
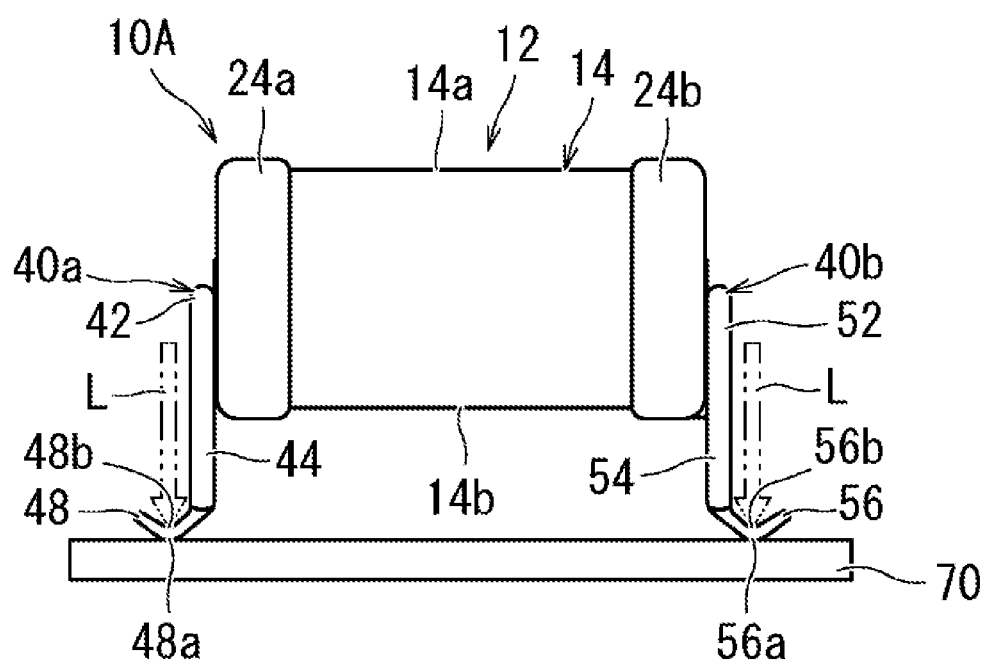
FIG. 6 is a schematic configuration diagram showing a state of a mounting structure of the multilayer ceramic electronic component according to the first preferred embodiment of the present invention.

A multilayer ceramic electronic component according to a first preferred embodiment of the present invention will be described. FIG. 1 is an external perspective view showing an example of a multilayer ceramic electronic component according to a first preferred embodiment of the present invention. FIG. 2 is a cross-sectional view taken along line II-II of FIG. 1 showing the multilayer ceramic electronic component according to the first preferred embodiment of the present invention, and FIG. 3 is a cross-sectional view taken along line III-III of FIG. 1 showing the multilayer ceramic electronic component according to the first preferred embodiment of the present invention. FIG. 4 is a cross-sectional view taken along line IV-IV of FIG. 1 showing the multilayer ceramic electronic component according to the first preferred embodiment of the present invention. FIG. 5 is an external perspective view showing a metal terminal included in the multilayer ceramic electronic component according to the first preferred embodiment of the present invention. FIG. 6 is a schematic configuration diagram showing a state of a mounting structure of the multilayer ceramic electronic component according to the first preferred embodiment of the present invention.

As shown in FIGS. 1 and 2, a multilayer ceramic electronic component 10A includes, for example, an electronic component body 12 and first and second metal terminals 40*a* and 40*b*. The electronic component body 12 and the first metal terminal 40*a* are connected via a first joining member 60*a*. The electronic component body 12 and the second metal terminal 40*b* are connected via a second joining member 60*b*.

The electronic component body 12 includes a rectangular or substantially rectangular parallelepiped laminate 14.

The laminate 14 includes a plurality of stacked ceramic layers 16 and a plurality of stacked internal electrode layers 18. The laminate 14 further includes a first main surface 14*a* and a second main surface 14*b* facing each other in a stacking direction x, a first side surface 14*c* and a second side surface 14*d* facing each other in a width direction y orthogonal or substantially orthogonal to the stacking direction x, and a first end surface 14*e* and a second end surface 14*f* facing each other in a length direction z orthogonal or substantially orthogonal to the stacking direction x and the width direction y. It is preferable that the laminate 14 is rounded at the corner portions and the ridge line portions. The corner portion is a portion at which three adjacent surfaces of the laminate intersect, and the ridge line portion is a portion at which two adjacent surfaces of the laminate intersect. In addition, unevenness or other irregularities may be provided on a portion or the entirety of the first main surface 14*a* and the second main surface 14*b*, the first side surface 14*c* and the second side surface 14*d*, and the first end surface 14*e* and the second end surface 14*f*.

The second main surface 14*b* of the laminate 14 is located on the mounting surface side of the mounting substrate on which the multilayer ceramic electronic component 10A is to be mounted.

The ceramic layer 16 includes an outer layer portion 16*a* including a plurality of the ceramic layers 16 and an inner layer portion 16*b* including a single or a plurality of the ceramic layers 16. The outer layer portions 16a are located on the first main surface 14a side and the second main surface 14b side of the laminate 14 and each of which is the ceramic layer 16 located between the first main surface 14a and the internal electrode layer 18 closest to the first main surface 14a and the ceramic layer 16 located between the second main surface 14b and the internal electrode layer 18 closest to the second main surface 14b. A region sandwiched between both outer layer portions 16a is the inner layer portion 16b.

The ceramic layer 16 may preferably be made of, for example, a dielectric material. As the dielectric material, for example, a dielectric ceramic including a component such as $BaTiO_3$, $CaTiO_3$, $SrTiO_3$, or $CaZrO_3$ may be used. When the dielectric ceramic includes the above-described dielectric material as a main component, depending on the properties of the desired electronic component body 12, there may be used the dielectric ceramic added with a component whose content is smaller than that of the main component may be added to the dielectric material, and examples of the component include an Mn compound, an Fe compound, a Cr compound, a Co compound, and an Ni compound.

When a piezoelectric ceramic is used for the laminate 14, the electronic component body defines and functions as a ceramic piezoelectric element. Specific examples of piezoelectric ceramic materials include PZT (lead titanate zirconate) based ceramic materials.

When a semiconductor ceramic is used for the laminate 14, the electronic component body defines and functions as a thermistor element. Specific examples of semiconductor ceramic materials include spinel-based ceramic materials.

When a magnetic ceramic is used for the laminate 14, the electronic component body defines and functions as an inductor element. When the electronic component body defines and functions as the inductor element, the internal electrode layer 18 is a coiled conductor. Specific examples of magnetic ceramic materials include ferrite ceramic materials.

The thickness of the fired ceramic layer 16 is preferably not less than about 0.5 μm and not more than about 80 μm, for example.

As shown in FIG. 2, the laminate 14 includes, for example, a plurality of rectangular or substantially rectangular first internal electrode layers 18a and a plurality of rectangular or substantially rectangular second internal electrode layers 18b as the plurality of internal electrode layers 18. The plurality of first internal electrode layers 18a and the plurality of second internal electrode layers 18b are embedded so as to be alternately arranged at regular intervals along the stacking direction x of the laminate 14.

The respective electrode surfaces of the first internal electrode layer 18a and the second internal electrode layer 18b are disposed perpendicularly or substantially perpendicularly to the direction in which the first metal terminal 40a and the second metal terminal 40b extend, and are disposed to be parallel or substantially parallel to the mounting surface.

On one end side of the first internal electrode layer 18a, a first extended electrode portion 20a is led out to the first end surface 14e of the laminate 14. On one end side of the second internal electrode layer 18b, a second extended electrode portion 20b is led out to the second end surface 14f of the laminate 14. Specifically, the first extended electrode portion 20a on one end side of the first internal electrode layer 18a is exposed on the first end surface 14e of the laminate 14. The second extended electrode portion 20b on one end side of the second internal electrode layer 18b is exposed on the second end surface 14f of the laminate 14.

The internal electrode layer 18 may be disposed to be parallel or substantially parallel, or perpendicular or substantially perpendicular to the mounting surface.

The laminate 14 includes a counter electrode portion 22a in which the first internal electrode layer 18a and the second internal electrode layer 18b face each other in the inner layer portion 16b of the ceramic layer 16. The laminate 14 further includes a side portion (hereinafter referred to as a "W gap") 22b of the laminate 14, which is provided between one end of the counter electrode portion 22a in the width direction y and the first side surface 14c and between the other end of the counter electrode portion 22a in the width direction y and the second side surface 14d. The laminate 14 further includes an end portion (hereinafter referred to as an "L gap") 22c of the laminate 14, which is provided between an end portion on the side opposite to the first extended electrode portion 20a of the first internal electrode layer 18a and the second end surface 14f and between an end portion on the side opposite to the second extended electrode portion 20b of the second internal electrode layer 18b and the first end surface 14e.

The internal electrode layer 18 preferably includes, for example, metal such as Ni, Cu, Ag, Pd, and Au or an alloy including one of those metals, for example an Ag—Pd alloy. The internal electrode layer 18 may preferably further include dielectric grains having the same or substantially the same composition as ceramics included in the ceramic layer 16.

The thickness of the internal electrode layer 18 is preferably not less than about 0.2 μm and not more than about 2.0 μm, for example.

An external electrode 24 is disposed on the first end surface 14e side and the second end surface 14f side of the laminate 14. The external electrode 24 includes a first external electrode 24a and a second external electrode 24b.

The first external electrode 24a is disposed on the surface of the first end surface 14e of the laminate 14 and extends from the first end surface 14e and partially covers the first main surface 14a, the second main surface 14b, the first side surface 14c, and the second side surface 14d. In this case, the first external electrode 24a is electrically connected to the first extended electrode portion 20a of the first internal electrode layer 18a. However, the first external electrode 24a may be disposed only on the surface of the first end surface 14e of the laminate 14.

The second external electrode 24b is disposed on the surface of the second end surface 14f of the laminate 14 and extends from the second end surface 14f and partially covers the first main surface 14a, the second main surface 14b, the first side surface 14c, and the second side surface 14d. In this case, the second external electrode 24b is electrically connected to the second extended electrode portion 20b of the second internal electrode layer 18b. However, the second external electrode 24a may be disposed only on the surface of the second end surface 14f of the laminate 14.

In the laminate 14, the first internal electrode layer 18a and the second internal electrode layer 18b face each other with the ceramic layer 16 interposed therebetween at each of the counter electrode portions 22a to provide an electrostatic capacitance. Thus, an electrostatic capacitance is obtained between the first external electrode 24a to which the first internal electrode layer 18a is connected and the second external electrode 24b to which the second internal electrode layer 18b is connected. Accordingly, the electronic component body having such a structure defines and functions as a capacitor element.

As shown in FIG. 2, the first external electrode 24a includes, in order from the laminate 14 side, a first underlying electrode layer 28a and a first plating layer 30a disposed on the surface of the first underlying electrode layer 28a. Similarly, the second external electrode 24b includes, in order from the laminate 14 side, a second underlying electrode layer 28b and a second plating layer 30b disposed on the surface of the second underlying electrode layer 28b.

The first underlying electrode layer 28a is disposed on the surface of the first end surface 14e of the laminate 14 and extends from the first end surface 14e and partially covers the first main surface 14a, the second main surface 14b, the first side surface 14c, and the second side surface 14d. However, the first underlying electrode layer 28a may be disposed only on the surface of the first end surface 14e of the laminate 14.

The second underlying electrode layer 28b is disposed on the surface of the second end surface 14f of the laminate 14 and extends from the second end surface 14f and partially covers the first main surface 14a, the second main surface 14b, the first side surface 14c, and the second side surface 14d. However, the second underlying electrode layer 28b may be disposed only on the surface of the second end surface 14f of the laminate 14.

Although the first underlying electrode layer 28a and the second underlying electrode layer 28b (hereinafter also simply referred to as the underlying electrode layer) each include at least one selected from a baking layer, a thin film layer and the like, in this preferred embodiment, the first underlying electrode layer 28a and the second underlying electrode layer 28b defined by the baking layer will be described.

The baking layer includes glass and metal. As the metal of the baking layer, the baking layer may preferably include, for example, at least one selected from Cu, Ni, Ag, Pd, Ag—Pd alloy, Au and other suitable material. As the glass of the baking layer, the baking layer may preferably include, for example, at least one selected from Si, Pd, Li, Na, K and other suitable material. The baking layer may include a plurality of layers. The baking layer is formed by applying a conductive paste including glass and metal onto the laminate 14 and baking the conductive paste, and the baking layer may be formed by being fired simultaneously with the ceramic layer 16 and the internal electrode layer 18 or may be formed by being baked after the ceramic layer 16 and the internal electrode layer 18 are fired. The thickness of the thickest portion of the baking layer is preferably not less than about 10 μm and not more than about 200 μm, for example.

A resin layer including conductive grains and a thermosetting resin may be provided on the surface of the baking layer. The resin layer may be directly disposed on the laminate 14 without forming the baking layer. The resin layer may include a plurality of layers. The thickness of the thickest portion of the resin layer is preferably not less than about 20 μm and not more than about 150 μm, for example.

The thin film layer is formed by a thin film forming method, such as a sputtering method or a vapor deposition method, and is preferably a layer of not more than about 1 μm, for example, in which metal grains are deposited.

The first plating layer 30a covers the first underlying electrode layer 28a. Specifically, it is preferable that the first plating layer 30a is disposed on the first end surface 14e at the surface of the first underlying electrode layer 28a and extends to the first and second main surfaces 14a and 14b and the first and second side surfaces 14c and 14d at the surface of the first underlying electrode layer 28a. When the first underlying electrode layer 28a is disposed only on the surface of the first end surface 14e of the laminate 14, it suffices that the first plating layer 30a covers only the surface of the first underlying electrode layer 28a.

Similarly, the second plating layer 30b covers the second underlying electrode layer 28b. Specifically, it is preferable that the second plating layer 30b is disposed on the second end surface 14f at the surface of the second underlying electrode layer 28b and extends to the first and second main surfaces 14a and 14b and the first and second side surfaces 14c and 14d at the surface of the second underlying electrode layer 28b. When the second underlying electrode layer 28b is disposed only on the surface of the second end surface 14f of the laminate 14, it suffices that the second plating layer 30b covers only the surface of the second underlying electrode layer 28b.

As the first plating layer 30a and the second plating layer 30b (hereinafter also simply referred to as the plating layer), for example, at least one metal selected from Cu, Ni, Sn, Ag, Pd, Ag—Pd alloy, Au and other suitable metal or an alloy including the selected metals is preferably used.

The plating layer may include a plurality of layers. In this case, it is preferable that the plating layer include a two-layer structure including a nickel plating layer and a tin plating layer, for example. By providing the nickel plating layer so as to cover the surface of the underlying electrode layer, the underlying electrode layer is prevented from being eroded by a solder used to join the first metal terminal 40a and the second metal terminal 40b. In addition, by providing the tin plating layer on the surface of the nickel plating layer, when the multilayer ceramic capacitor is mounted, it is possible to improve wettability of a solder used for the mounting, so that the multilayer ceramic capacitor is easily mounted.

The thickness per layer of the plating layers is preferably not less than about 1 μm and not more than about 20 μm, for example. Further, it is preferable that the plating layer does not include glass. Furthermore, it is preferable that a metal proportion per unit volume in the plating layer is not less than about 99% by volume, for example.

Next, the case in which the first underlying electrode layer 28a and the second underlying electrode layer 28b are defined by plating electrodes will be described. The first underlying electrode layer 28a is defined by a plating layer directly connected to the first internal electrode layer 18a. The first underlying electrode layer 28a is disposed directly on the surface of the first end surface 14e of the laminate 14 and extends from the first end surface 14e and partially covers the first main surface 14a, the second main surface 14b, the first side surface 14c, and the second side surface 14d.

In addition, the second underlying electrode layer 28b is defined by a plating layer directly connected to the second internal electrode layer 18b. The second underlying electrode layer 28b is disposed directly on the surface of the second end surface 14f of the laminate 14 and extends from the second end surface 14f and partially cover the first main surface 14a, the second main surface 14b, the first side surface 14c, and the second side surface 14d.

However, in order for the first underlying electrode layer 28a or the second underlying electrode layer 28b to be defined by the plating layer, a catalyst is provided on the laminate 14 as a pretreatment.

It is preferable that the first underlying electrode layer 28a defined by the plating layer is covered with the first plating layer 30a. Similarly, it is preferable that the second underlying electrode layer 28b defined by the plating layer is covered with the second plating layer 30b.

It is preferable that the first and second underlying electrode layers 28a and 28b and the first and second plating layers 30a and 30b include, for example, plating of a metal selected from Cu, Ni, Sn, Pb, Au, Ag, Pd, Bi, and Zn or an alloy including the selected metals.

For example, when Ni is used as the internal electrode layer 18, Cu having good joinability with Ni is preferably used as the first underlying electrode layer 28a and the second underlying electrode layer 28b.

As the first plating layer 30a and the second plating layer 30b, for example, Sn or Au with good solder wettability is preferably used. As the first underlying electrode layer 28a and the second underlying electrode layer 28b, for example, Ni having solder barrier performance is preferably used.

The first plating layer 30a and the second plating layer 30b are provided as required, the first external electrode 24a may be defined by only the first underlying electrode layer 28a, and the second external electrode 24b may be defined by only the second underlying electrode layer 28b. The first plating layer 30a and the second plating layer 30b may be provided as the outermost layers of the first external electrode 24a and the second external electrode 24b, and another plating layer may be provided on the first plating layer 30a or the second plating layer 30b.

The thickness per layer of the plating layers is preferably not less than about 1 μm and not more than about 15 μm, for example. Further, it is preferable that the plating layer does not contain glass. Furthermore, it is preferable that a metal proportion per unit volume in the plating layer be not less than about 99% by volume, for example. The first and second underlying electrode layers 28a and 28b each defined by the plating layer and the first and second plating layers 30a and 30b are grain-grown along the thickness direction, and have a columnar shape.

The plating layer may be disposed directly on the surface of the laminate 14 without providing the first and second underlying electrode layers 28a and 28b. When the plating layer is disposed directly on the surface of the laminate 14, the plating layer preferably includes, for example, at least one metal selected from Cu, Ni, Sn, Pb, Au, Ag, Pd, Bi, Zn and other metal or an alloy including the selected metals.

The first metal terminal 40a as shown in FIG. 5 is connected to the first external electrode 24a of the electronic component body 12 with the first joining material 60a interposed therebetween. The second metal terminal 40b as shown in FIG. 5 is connected to the second external electrode 24b of the electronic component body 12 with the second joining material 60b interposed therebetween. The first metal terminal 40a and the second metal terminal 40b are provided to mount the multilayer ceramic electronic component 10A on the mounting substrate.

The first metal terminal 40a is preferably defined by, for example, a lead wire having a circular or substantially circular cross-sectional shape. The first metal terminal 40a includes a first terminal joining portion 42 which extends in the width direction y connecting the first side surface 14c and the second side surface 14d and is connected to the first end surface 14e, a first extending portion 44 and a second extending portion which extend from both ends of the first terminal joining portion 42 and extend toward the mounting surface such that a gap is provided between the second main surface 14b of the multilayer ceramic electronic component 10A and the mounting surface of the mounting substrate, a first mounting portion 48 which is connected to the first extending portion 44 and extends in a length direction z connecting the first end surface 14e and the second end surface 14f on the side opposite to the electronic component body 12 side, and a second mounting portion 50 which is connected to the second extending portion 46 and extends in the length direction z connecting the first end surface 14e and the second end surface 14f on the side opposite to the electronic component body 12 side.

The first metal terminal 40a may not be defined by a lead wire, but may be defined by two lead wires, and the first extending portion 44 and the second extending portion 46 may independently extend toward the mounting surface. In that case, the first terminal joining portion 42 is provided at each end of the first extending portion 44 and the second extending portion 46.

The second metal terminal 40b is preferably defined by, for example, a lead wire having a circular or substantially circular cross-sectional shape. The second metal terminal 40b includes a second terminal joining portion 52 which extends in the height direction of the second end surface 14f and is connected to the second end surface 14f, a third extending portion 54 which is connected to the second terminal joining portion 52 and extends toward the mounting surface such that a gap is provided between the second main surface 14b of the multilayer ceramic electronic component 10A and the mounting surface of the mounting substrate, and a third mounting portion 56 which is connected to the third extending portion 54 and extends in the length direction z connecting the first end surface 14e and the second end surface 14f on the side opposite to the electronic component body 12 side. In the present preferred embodiment, the height direction is the same as the stacking direction x.

The first terminal joining portion 42 of the first metal terminal 40a is connected to the first external electrode 24a, which is provided on the first end surface 14e of the electronic component body 12, with the first joining material 60a interposed therebetween, for example, so as to extend in the width direction y connecting the first side surface 14c and the second side surface 14d. The length of the first terminal joining portion 42 is not particularly limited, and the first terminal joining portion 42 may cover the entire width direction y of the first end surface 14e or may be disposed to fit in the width direction y.

The second terminal joining portion 52 of the second metal terminal 40b is connected to the second external electrode 24b, which is provided on the second end surface 14f of the electronic component body 12, with the second joining material 60b interposed therebetween, for example, so as to extend in the height direction connecting the first main surface 14a and the second main surface 14b. The length of the second terminal joining portion 52 is not particularly limited, and the second terminal joining portion 52 may cover the entire height direction of the second end surface 14f or may be disposed to fit in the height direction.

The first extending portion 44 of the first metal terminal 40a extends from one end of the first terminal joining portion 42 and extends toward the mounting surface such that a gap is provided between the second main surface 14b of the electronic component body 12 and the mounting surface of the mounting substrate. The second extending portion 46 of the first metal terminal 40a extends from the other end of the first terminal joining portion 42 and extends toward the mounting surface such that a gap is provided between the second main surface 14b of the electronic component body 12 and the mounting surface of the mounting substrate.

The third extending portion 54 of the second metal terminal 40b extends from a lower end of the second terminal joining portion 52 and extends toward the mounting surface such that a gap is provided between the second main surface 14b of the electronic component body 12 and the mounting surface of the mounting substrate.

The first extending portion 44 and the second extending portion 46 of the first metal terminal 40a and the third extending portion 54 of the second metal terminal 40b are provided to space the electronic component body 12 away from the mounting substrate on which the multilayer ceramic electronic component 10A is mounted. Consequently, a stress caused by a difference in thermal expansion coefficient between the mounting substrate and the multilayer ceramic electronic component 10A, a stress caused by deflection of the mounting substrate, or mechanical distortion occurring in the ceramic layer caused by a voltage applied is able to be absorbed by elastic deformation of the first extending portion 44, the second extending portion 46, and the third extending portion 54. As a result, it is possible to reduce or prevent problems, such as occurrence of cracks in the multilayer ceramic electronic component 10A and separation of the first metal terminal 40a and the second metal terminal 40b from the electronic component body 12, and the vibration is prevented from being transmitted to the mounting substrate through the first metal terminal 40a and the second metal terminal 40b, so that the occurrence of noise (squeal) is able to be reduced.

The first mounting portion 48 of the first metal terminal 40a is connected to a front end of the first extending portion 44 and extends in the length direction z connecting the first end surface 14e and the second end surface 14f on the side opposite to the electronic component body 12 side. The second mounting portion 50 of the first metal terminal 40a is connected to a front end of the second extending portion 46 and extends in the length direction z connecting the first end surface 14e and the second end surface 14f on the side opposite to the electronic component body 12 side. The third mounting portion 56 of the second metal terminal 40b is connected to a front end of the third extending portion 54 and extends in the length direction z connecting the first end surface 14e and the second end surface 14f on the side opposite to the electronic component body 12 side.

In the present preferred embodiment, the first mounting portion 48, the second mounting portion 50, and the third mounting portion 56 extend on the side opposite to the electronic component body 12 side, but conversely may extend toward the electronic component body 12. However, when the first mounting portion 48, the second mounting portion 50, and the third mounting portion 56 extend on the side opposite to the electronic component body 12 side, it is preferable because mounting by welding to the mounting substrate is able to be easily performed.

The length in the length direction z connecting the first end surface 14e and the second end surface 14f of each of the first mounting portion 48, the second mounting portion 50, and the third mounting portion 56 may be longer than the length in the height direction connecting the first main surface 14a and the second main surface 14b of each of the first extending portion 44, the second extending portion 46, and the third extending portion 54.

Further, a boundary portion at which the first extending portion 44 and the first mounting portion 48 intersect substantially at right angles, a boundary portion where the second extending portion 46 and the second mounting portion 50 intersect substantially at right angles, and a boundary portion where the third extending portion 54 and the third mounting portion 56 intersect substantially at right angles may be rounded.

The shape of the first mounting portion 48 is rectangular or substantially rectangular in plan view, and the central portion thereof is bent parallel or substantially parallel to the width direction y connecting the first side surface 14c and the second end surface 14d, and a linear first protrusion bending portion 48a protruding toward the mounting surface of the mounting substrate is provided. A recess on the side opposite to the mounting surface side of the mounting substrate in the first protrusion bending portion 48a is defined as a linear first recess bending portion 48b parallel or substantially parallel to the width direction y connecting the first side surface 14c and the second end surface 14d.

The shape of the second mounting portion 50 is rectangular or substantially rectangular in plan view, and the central portion thereof is bent parallel or substantially parallel to the width direction y connecting the first side surface 14c and the second end surface 14d, and a linear second protrusion bending portion 50a protruding toward the mounting surface of the mounting substrate is provided. A recess on the side opposite to the mounting surface side of the mounting substrate in the second protrusion bending portion 50a is defined as a linear second recess bending portion 50b parallel or substantially parallel to the width direction y connecting the first side surface 14c and the second end surface 14d.

The shape of the third mounting portion 56 is rectangular or substantially rectangular in plan view, and the central portion thereof is bent parallel or substantially parallel to the width direction y connecting the first side surface 14c and the second end surface 14d, and a linear third protrusion bending portion 56a protruding toward the mounting surface of the mounting substrate is provided. A recess on the side opposite to the mounting surface side of the mounting substrate in the third protrusion bending portion 56a is defined as a linear third recess bending portion 56b parallel or substantially parallel to the width direction y connecting the first side surface 14c and the second end surface 14d.

The respective apexes of the first protrusion bending portion 48a, the second protrusion bending portion 50a, and the third protrusion bending portion 56a protruding toward the mounting surface of the mounting substrate are disposed to be in contact with the mounting surface of the mounting substrate. At this time, the first protrusion bending portion 48a, the second protrusion bending portion 50a, and the third protrusion bending portion 56a are disposed so as not to be positioned on a straight line. According to the present preferred embodiment, with such a configuration, it is possible to provide a configuration in which the protrusion bending portions are in line contact with the mounting surface of the mounting substrate at three positions with short line segments. Consequently, even if the mounting substrate warps, or a connection portion is not disposed in a single plane due to a step difference, it is possible to achieve a state in which the mounting surface reliably contacts at three positions, and to reliably perform mounting by welding.

Since a contact area between the mounting substrate and each of the first mounting portion 48 and the second mounting portion 50 of the first metal terminal 40a and the third mounting portion 56 of the second metal terminal 40b is small, welding is able to be performed only by applying laser to the first recess bending portion 48b on the opposite side of the mounting surface of the mounting substrate in the first protrusion bending portion 48a, the second recess bending portion 50b on the opposite side of the mounting surface of the mounting substrate in the second protrusion bending portion 50a, and the third recess bending portion 56b on the opposite side of the mounting surface of the mounting substrate in the third protrusion bending portion 56a, and therefore, the welding time is shortened.

The first protrusion bending portion 48a, the second protrusion bending portion 50a, and the third protrusion bending portion 56a may be angular or may be rounded. The first mounting portion 48 and the second mounting portion 50 of the first metal terminal 40a are formed by slightly pressing and crushing both end portions of the lead wire defining the first metal terminal 40a. The third mounting portion 56 of the second metal terminal 40b is formed by slightly pressing and crushing an end portion of the lead wire defining the second metal terminal 40b.

In the multilayer ceramic electronic component 10A according to the present preferred embodiment, a height h of the first, second, and third protrusion bending portions 48a, 50a, and 56a from bottom surfaces of the first, second, and third mounting portions 48, 50, and 56 is preferably not less than about 0.1 mm and not more than about 1 mm, for example. Consequently, a distance between the first, second, and third mounting portions 48, 50, and 56 and the mounting surface of the mounting substrate is adequately ensured, and it is possible to efficiently absorb laser energy and to obtain the advantageous effects of preferred embodiments of the present invention more effective.

It is preferable that the surfaces of the first and second metal terminals 40a and 40b include a black color or an oxidized coating. Consequently, absorption efficiency of laser energy is increased, and laser welding is able to be easily performed in a short time.

The first metal terminal 40a and the second metal terminal 40b each include a terminal body and a plating film provided on a surface of the terminal body.

The terminal body is preferably made of, for example, Ni, Fe, Cu, Ag, Cr, or an alloy primarily including one or more of these metals. The terminal body is more preferably made of, for example, Ni, Fe, Cu, Cr, or an alloy primarily including one or more of these metals. Specifically, for example, the metal of the parent material of the terminal body may be Fe-42 Ni alloy, Fe-18 Cr alloy, or Cu-8 Sn alloy. The diameters of the first metal terminal (lead wire) 40a and the second metal terminal (lead wire) 40b are preferably about not less than about 0.4 mm and not more than about 0.8 mm, for example. If the diameters of the first metal terminal 40a and the second metal terminal 40b exceed about 0.8 mm, there is a possibility of poor compatibility with through-hole board mounting and welding mounting, and if the diameters are less than about 0.4 mm, the lead wire may be broken during product processing, mounting, and actual loading.

The plating film preferably includes, for example, a lower layer plating film and an upper layer plating film.

The lower layer plating film is provided on the surface of the terminal body, and the upper layer plating film is provided on a surface of the lower layer plating film. Each of the lower layer plating film and the upper layer plating film may include a plurality of plating layers.

At least a peripheral surface 49 of the first extending portion 44 and the first mounting portion 48 of the first metal terminal 40a, a peripheral surface 51 of the second extending portion 46 and the second mounting portion 50, and a peripheral surface 57 of the third extending portion 54 and the third mounting portion 56 of the second metal terminal 40b may not include a plating film. Consequently, when the multilayer ceramic electronic component 10A is mounted on the mounting substrate using solder, wetting up of the solder to the first metal terminal 40a and the second metal terminal 40b is reduced or prevented. Thus, it is possible to prevent the solder from wetting up between the electronic component body 12 and the first and second metal terminals 40a and 40b (floating portion), so that the floating portion is prevented from being filled with the solder. Thus, it is possible to sufficiently secure a space between the electronic component body 12 and the first and second metal terminals 40a and 40b. Accordingly, the first extending portion 44 and the second extending portion 46 of the first metal terminal 40a and the third extending portion 54 of the second metal terminal 40b are easily elastically deformed, so that mechanical distortion occurring in the ceramic layer 16 is further absorbed by application of AC voltage. Consequently, it is possible to reduce or prevent transmission of vibration generated at this time to the mounting substrate with the external electrode 24 interposed therebetween. Accordingly, by providing the first metal terminal 40a and the second metal terminal 40b, it is possible to more stably reduce or prevent generation of acoustic noise (squeal). A plating film may not be provided on the entire or substantially the entire peripheral surface of each of the first metal terminal 40a and the second metal terminal 40b.

In the case of removing the plating film on the first extending portion 44, the second extending portion 46, the first mounting portion 48, and the second mounting portion 50 of the first metal terminal 40a and the third extending portion 54 and the third mounting portion 56 of the second metal terminal 40b or the plating film on the entire or substantially the entire peripheral surfaces of the first metal terminal 40a and the second metal terminal 40b, the following methods are considered: a removal (cutting or polishing) method using a machine, a removal method using laser trimming, a removal method using a plating peeling agent (for example, sodium hydroxide), and a method of covering a portion provided with no plating with a resist film before forming the plating films of the first and second metal terminals 40a and 40b, and removing the resist film after forming the plating films of the first and second metal terminals 40a and 40b.

The lower layer plating film is preferably made of, for example, Ni, Fe, Cu, Ag, Cr, or an alloy primarily including one or more of these metals. The lower layer plating film is more preferably made of, for example, Ni, Fe, Cr, or an alloy primarily made of one or more of these metals. When the lower layer plating film is made of Ni, Fe or Cr having a high melting point, or an alloy primarily made of one or more of these metals, heat resistance of the external electrode 24 is improved. The thickness of the lower layer plating film is preferably not less than about 0.2 µm and not more than about 5.0 µm, for example.

The upper layer plating film is preferably made of, for example, Sn, Ag, Au, or an alloy primarily made of one or more of these metals. The upper layer plating film is further preferably made of, for example, Sn or an alloy primarily made of Sn. When the upper layer plating film is made of Sn or an alloy primarily made of Sn, solderability between the first and second metal terminals 40a and 40b and the external electrode 24 is improved. The thickness of the upper layer plating film is preferably not less than about 1.0 µm and not more than about 20 µm, for example.

When each of the terminal body and the lower layer plating film is made of Ni, Fe or Cr having a high melting point, or an alloy primarily made of one or more of these metals, heat resistance of the external electrode 24 is improved.

The first joining material 60a is used to join the first external electrode 24a and the first terminal joining portion 42 of the first metal terminal 40a. The first joining material 60a is provided between the first terminal joining portion 42 of the first metal terminal 40a and the first external electrode 24a (the first external electrode 24a on the end surface 14e) facing the first terminal joining portion 42. The first joining material 60a extends in the width direction y connecting the first side surface 14c and the second side surface 14d at the central portion of the first external electrode 24a.

The second joining material 60b is used to join the second external electrode 24b and the second terminal joining portion 52 of the second metal terminal 40b. The second joining material 60b exists between the second terminal joining portion 52 of the second metal terminal 40b and the second external electrode 24b (the second external electrode 24b on the end surface 14f) facing the second terminal joining portion 52. The second joining material 60b extends in the height direction connecting the first main surface 14a and the second main surface 14b at the central portion of the second external electrode 24b.

As the first and second joining materials 60a and 60b, solder, a conductive adhesive, or other suitable joining materials, for example, may preferably be used.

As the solder, for example, LF solder such as Sn—Sb, Sn—Ag—Cu, Sn—Cu, or Sn—Bi solder is preferably used. In the case of Sn—Sb solder, the Sb content is preferably about not less than about 5% and not more than about 15%, for example.

As the conductive adhesive, for example, a bonding agent obtained by adding a metal filler of Ag or other suitable filler to a thermosetting resin, such as an epoxy resin, is preferably used.

The dimension in the length direction z of the multilayer ceramic electronic component 10A is defined as the L dimension, the dimension in the stacking direction x of the multilayer ceramic electronic component 10A is defined as the T dimension, and the dimension in the width direction y of the multilayer ceramic electronic component 10A is defined as the W dimension.

As the dimensions of the multilayer ceramic electronic component 10A, preferably the L dimension in the length direction z is not less than about 1.8 mm and not more than about 35.0 mm, the W dimension in the width direction y is not less than about 1.0 mm and not more than about 40.0 mm, and the T dimension in the stacking direction x is not less than about 0.6 mm and not more than about 4.0 mm, for example.

Next, the mounting structure of a multilayer ceramic electronic component 10A according to a preferred embodiment of the present invention will be described.

As shown in FIG. 6, the multilayer ceramic electronic component 10A is mounted on a mounting substrate 70. Specifically, the multilayer ceramic electronic component 10A is disposed on the mounting surface of the mounting substrate 70, and is joined to the mounting substrate 70 by welding in the first protrusion bending portion 48a of the first mounting portion 48 and the second protrusion bending portion 50a of the second mounting portion 50 of the first metal terminal 40a and the third protrusion bending portion 56a of the third mounting portion 56 of the second metal terminal 40b.

In the joining by welding, it is preferable that the multilayer ceramic electronic component is joined by welding using laser L. That is, mounting by welding is performed while applying the laser L to the first recess bending portion 48b on the opposite side of the mounting surface of the mounting substrate 70 at the position of the first protrusion bending portion 48a, the second recess bending portion 50b on the opposite side of the mounting surface of the mounting substrate 70 at the position of the second protrusion bending portion 50a, and the third recess bending portion 56b on the opposite side of the mounting surface of the mounting substrate 70 at the position of the third protrusion bending portion 56a.

According to the multilayer ceramic electronic component 10A of the first preferred embodiment, since the first protrusion bending portion 48a of the first mounting portion 48, the second protrusion bending portion 50a of the second mounting portion 50, and the third protrusion bending portion 56a of the third mounting portion 56 are formed by bending, it is possible to utilize a configuration in which the protrusion bending portions are in line contact with the mounting surface of the mounting substrate 70 at three positions with short line segments. Consequently, even if the mounting substrate 70 warps, or a connection portion is not disposed in a single plane due to a step difference, it is possible to achieve a state in which the protrusions are reliably in contact with the mounting substrate 70 at three positions, and to reliably perform mounting by laser welding.

Since the first protrusion bending portion 48a of the first mounting portion 48 and the second protrusion bending portion 50a of the second mounting portion 50 of the first metal terminal 40a and the third protrusion bending portion 56a of the third mounting portion 56 of the second metal terminal 40b are in line contact with the mounting substrate 70 with short line segments, mounting by welding is able to be performed while irradiating the laser L aiming at portions having small contact areas and small areas of the linear first recess bending portion 48b, the linear second recess bending portion 50b, and the linear third recess bending portion 56b, so that mounting by welding is easily performed in a short time.

Second Preferred Embodiment

Figure 7:
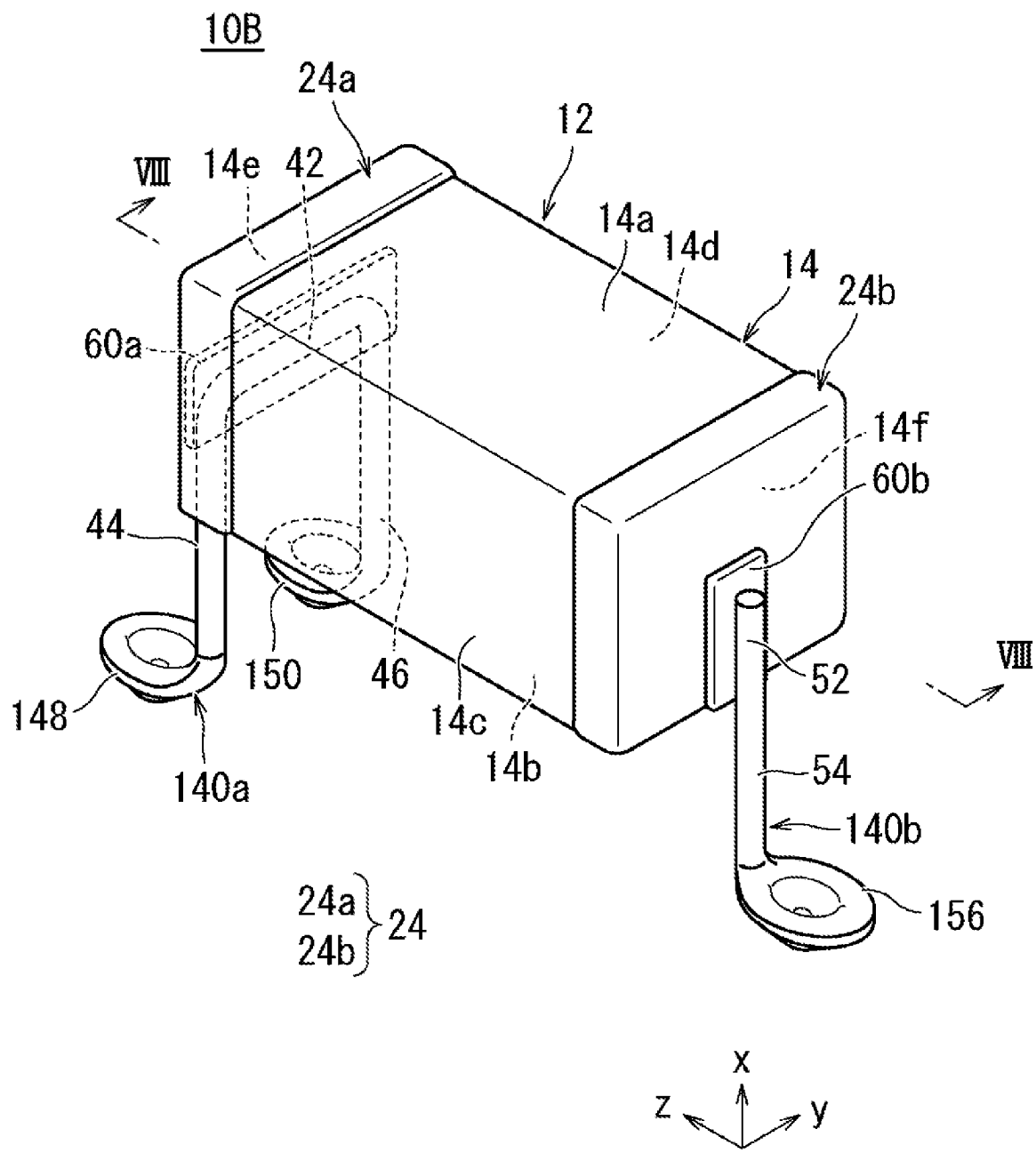
FIG. 7 is an external perspective view showing an example of a multilayer ceramic electronic component according to a second preferred embodiment of the present invention.
Figure 8:
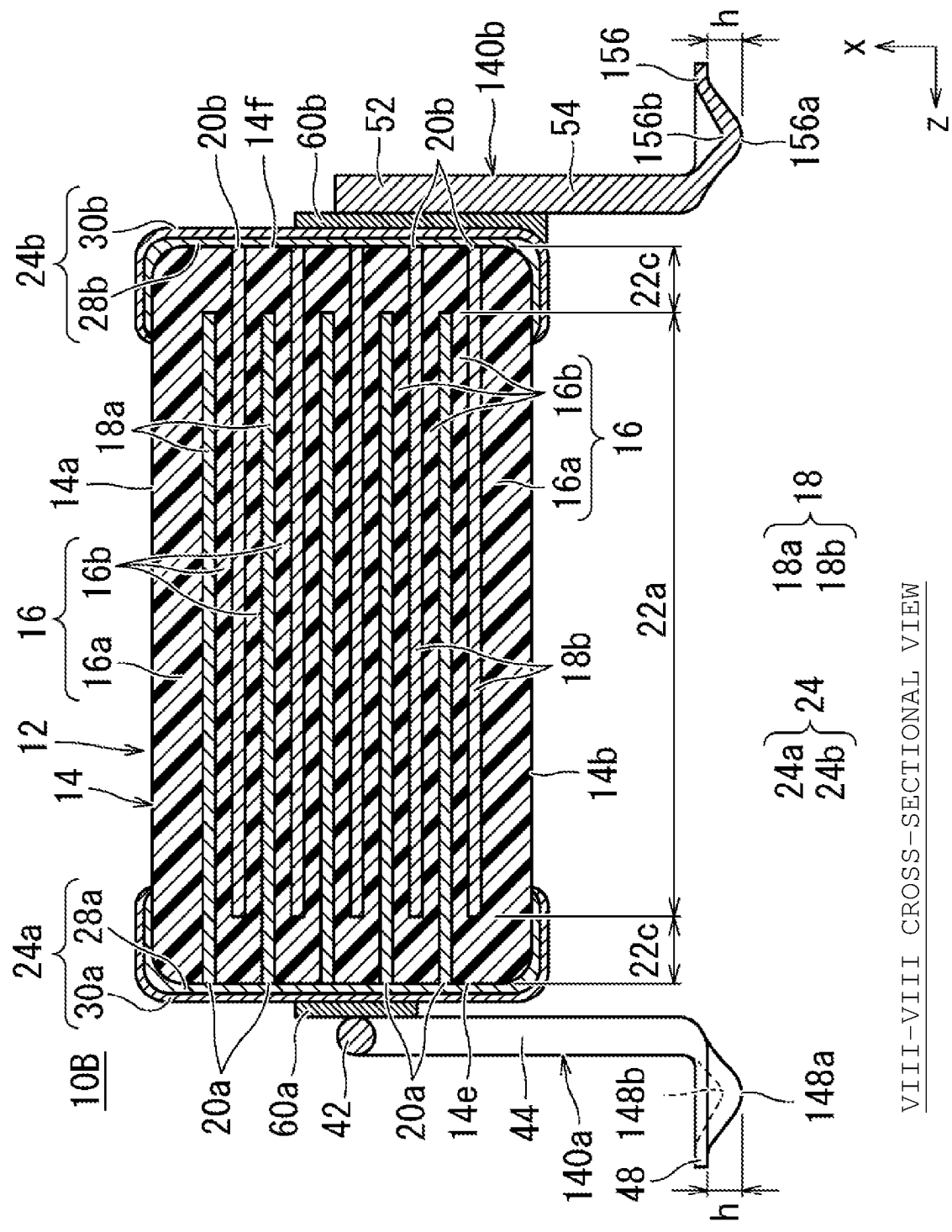
FIG. 8 is a cross-sectional view taken along line VIII-VIII of FIG. 7 showing the multilayer ceramic electronic component according to the second preferred embodiment of the present invention.
Figure 9:
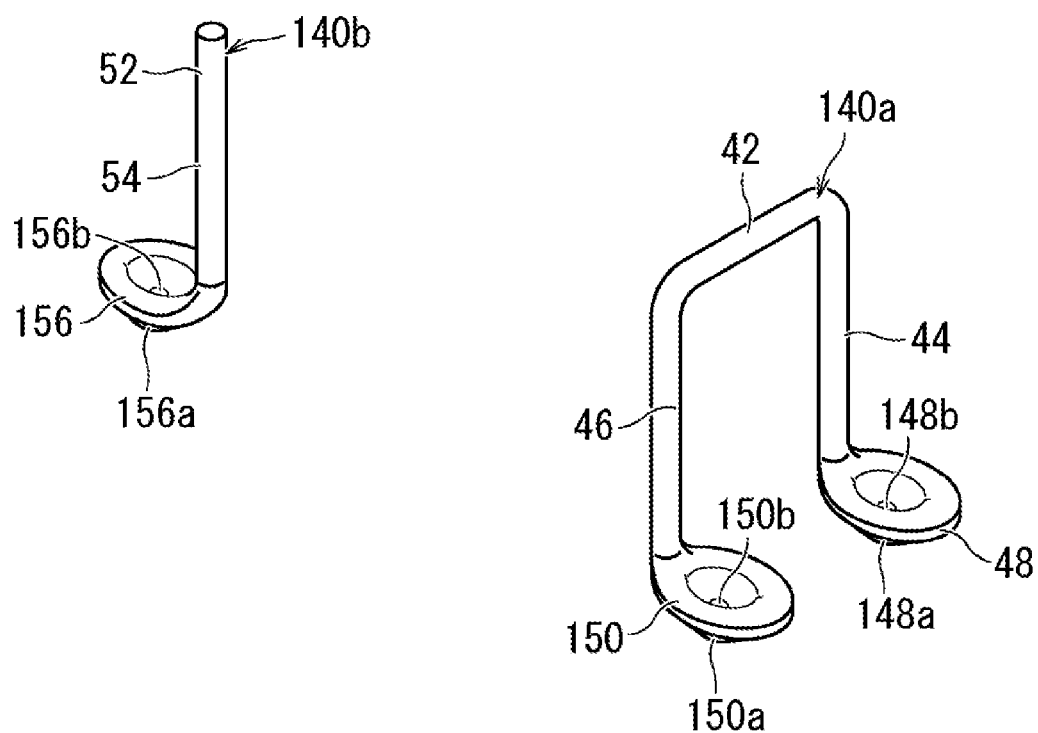
FIG. 9 is an external perspective view showing a metal terminal included in the multilayer ceramic electronic component according to the second preferred embodiment of the present invention.
Figure 10:
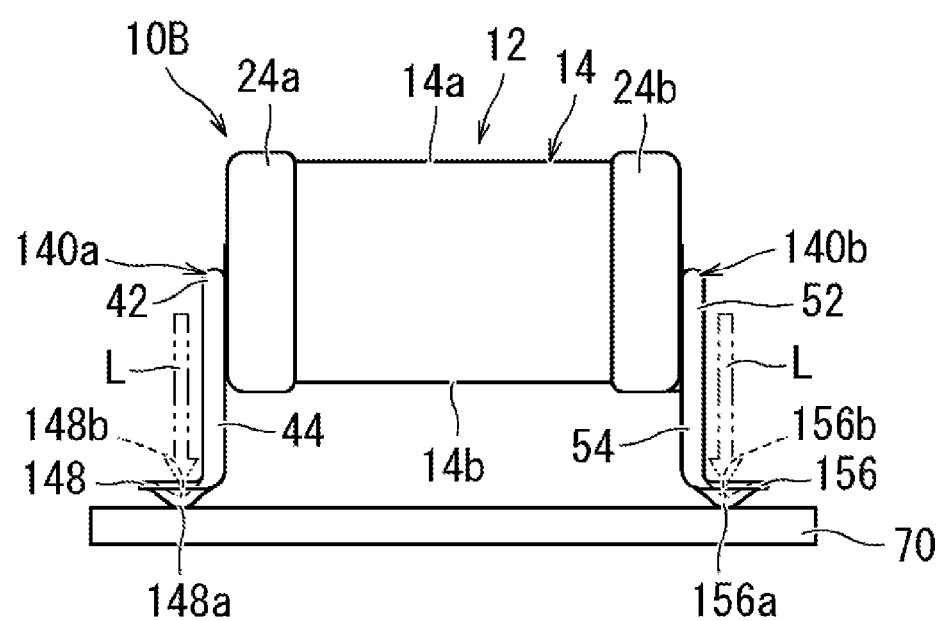
FIG. 10 is a schematic configuration diagram showing a state of a mounting structure of the multilayer ceramic electronic component according to the second preferred embodiment of the present invention.

A multilayer ceramic electronic component according to a second preferred embodiment of the present invention will be described. FIG. 7 is an external perspective view showing an example of the multilayer ceramic electronic component according to the second preferred embodiment of the present invention. FIG. 8 is a cross-sectional view taken along line VIII-VIII of FIG. 7 showing the multilayer ceramic electronic component according to the second preferred embodiment of the present invention. FIG. 9 is an external perspective view showing a metal terminal included in the multilayer ceramic electronic component according to the second preferred embodiment of the present invention. FIG. 10 is a schematic configuration diagram showing a state of a mounting structure of the multilayer ceramic electronic component according to the second preferred embodiment of the present invention.

A multilayer ceramic electronic component 10B according to the second preferred embodiment has the same or substantially the same configuration as that of the multilayer ceramic electronic component 10A described using FIG. 1, except that the configuration of a first mounting portion 148 and a second mounting portion 150 of a first metal terminal 140a and a third mounting portion 156 of a second metal terminal 140b is different from the configuration of the first mounting portion 48 and the second mounting portion 50 of the first metal terminal 40a and the third mounting portion of the second metal terminal 40b of the first preferred embodiment. Accordingly, the same elements and features as those of the multilayer ceramic electronic component 10A shown in FIG. are denoted by the same reference numerals, and description thereof is omitted.

As shown in FIG. 9, the first metal terminal 140a and the second metal terminal 140b used in the multilayer ceramic electronic component 10B shown in FIG. 7 are provided such that the first mounting portion 148 and the second mounting portion 150 of the first metal terminal 140a and the third mounting portion 156 of the second metal terminal 140b have a circular or substantially circular shape.

That is, the first mounting portion 148 of the first metal terminal 140a is sufficiently pressed and crushed into a circular shape and includes at its central portion a hemispherical or substantially hemispherical first protrusion bending portion 148a protruding toward the mounting surface of the mounting substrate. A recess on the side opposite to the mounting surface side of the mounting substrate in the first protrusion bending portion 148a is defined as a hemispherical or substantially hemispherical first recess bending portion 148b.

The second mounting portion 150 of the first metal terminal 140a is sufficiently pressed and crushed into a circular or substantially circular shape and includes at its central portion a hemispherical or substantially hemispherical second protrusion bending portion 150a protruding toward the mounting surface of the mounting substrate. A recess on the side opposite to the mounting surface side of the mounting substrate in the second protrusion bending portion 150a is defined as a hemispherical or substantially hemispherical second recess bending portion 150b.

The third mounting portion 156 of the second metal terminal 140b is sufficiently pressed and crushed into a circular or substantially circular shape and has at its central portion a hemispherical or substantially hemispherical third protrusion bending portion 156a protruding toward the mounting surface of the mounting substrate. A recess on the side opposite to the mounting surface side of the mounting substrate in the third protrusion bending portion 156a is defined as a hemispherical or substantially hemispherical third recess bending portion 156b.

The respective apexes of the first protrusion bending portion 148a, the second protrusion bending portion 150a, and the third protrusion bending portion 156a protruding toward the mounting surface of the mounting substrate are disposed to be in contact with the mounting surface of the mounting substrate. At this time, the first protrusion bending portion 148a, the second protrusion bending portion 150a, and the third protrusion bending portion 156a are disposed so as not to be positioned on a straight line. According to the present preferred embodiment, with such a configuration, it is possible to provide a configuration in which the protrusion bending portions are in point contact with the mounting surface of the mounting substrate at three positions (or are in line contact therewith with short line segments, or are in surface contact therewith with small areas). Consequently, even if the mounting substrate warps, or a connection portion is not disposed in a single plane due to a step difference, it is possible to achieve a state in which the mounting surface reliably contacts at three positions, and to reliably perform mounting by welding.

Since the first mounting portion 148 and the second mounting portion 150 of the first metal terminal 140a and the third mounting portion 156 of the second metal terminal 140b are in point contact with the mounting substrate, the contact area with the mounting substrate is reduced as compared to the first preferred embodiment. Consequently, when a laser is applied to the first recess bending portion 148b on the opposite side of the mounting surface of the mounting substrate in the first protrusion bending portion 148a, the second recess bending portion 150b on the opposite side of the mounting surface of the mounting substrate in the second protrusion bending portion 150a, and the third recess bending portion 156b on the opposite side of the mounting surface of the mounting substrate in the third protrusion bending portion 156a, the area is small, and therefore, the welding time is further shortened.

Third Preferred Embodiment

Figure 11:
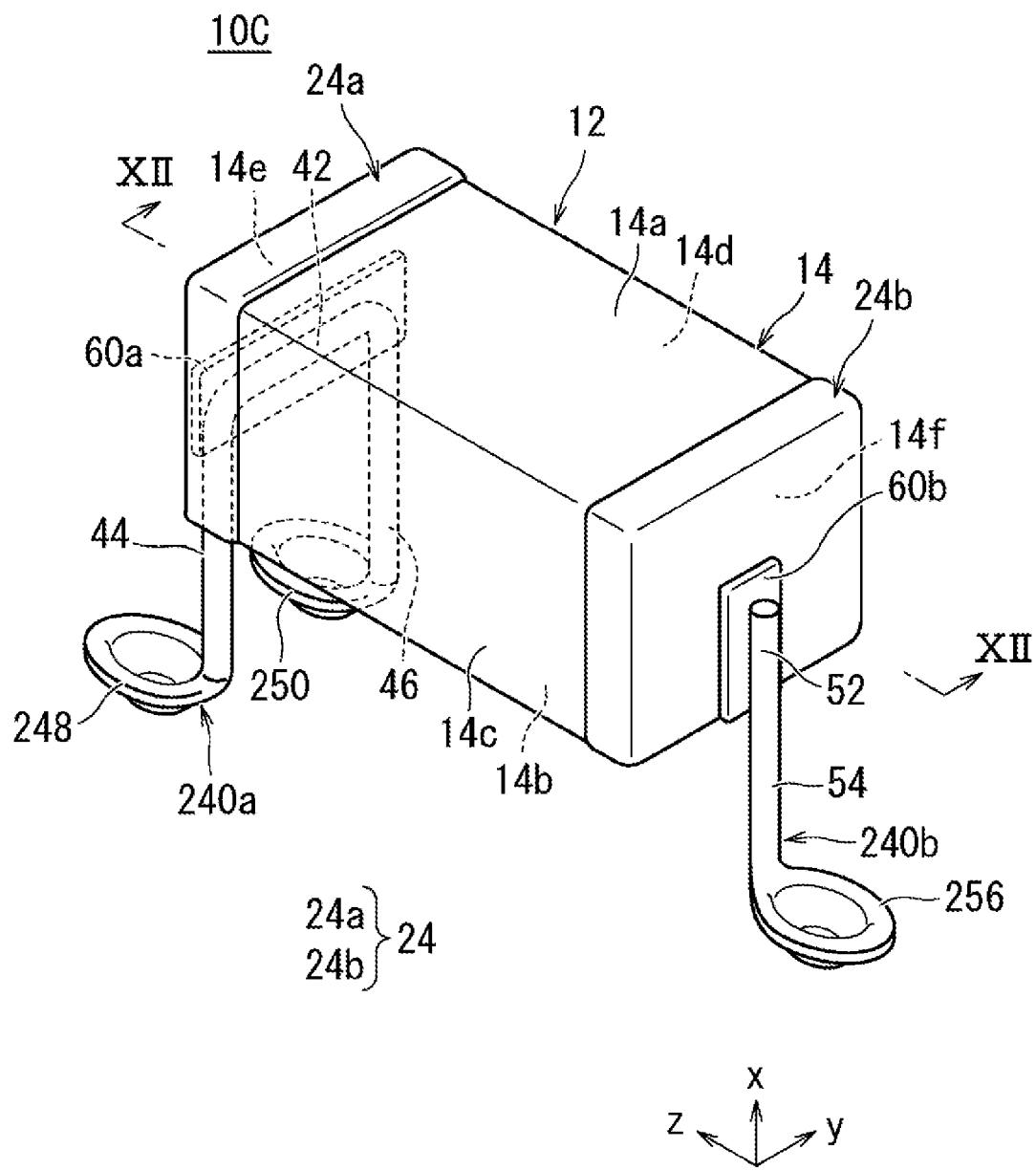
FIG. 11 is an external perspective view showing an example of a multilayer ceramic electronic component according to a third preferred embodiment of the present invention.
Figure 12:
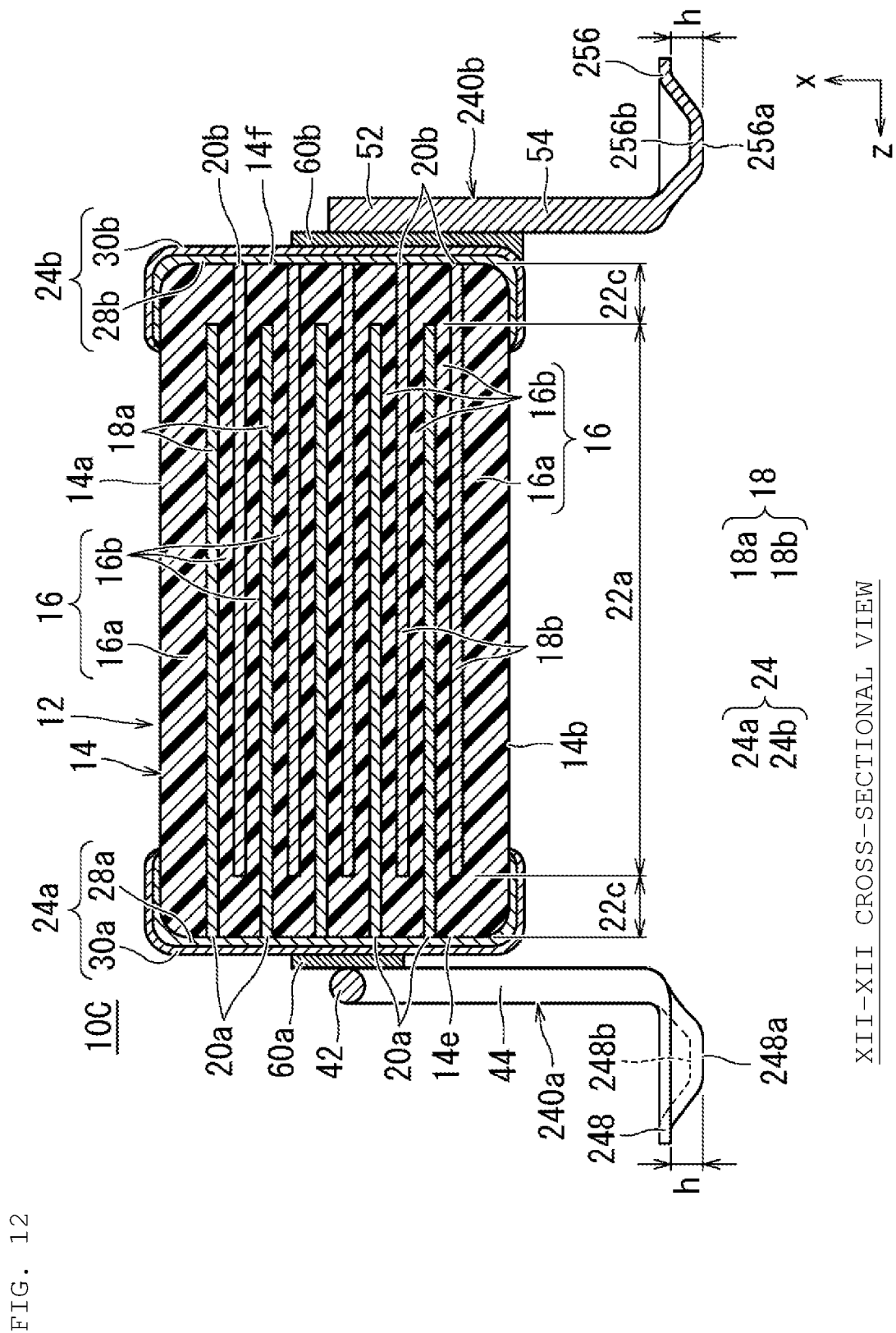
FIG. 12 is a cross-sectional view taken along line XII-XII of FIG. 11 showing the multilayer ceramic electronic component according to the third preferred embodiment of the present invention.
Figure 13:
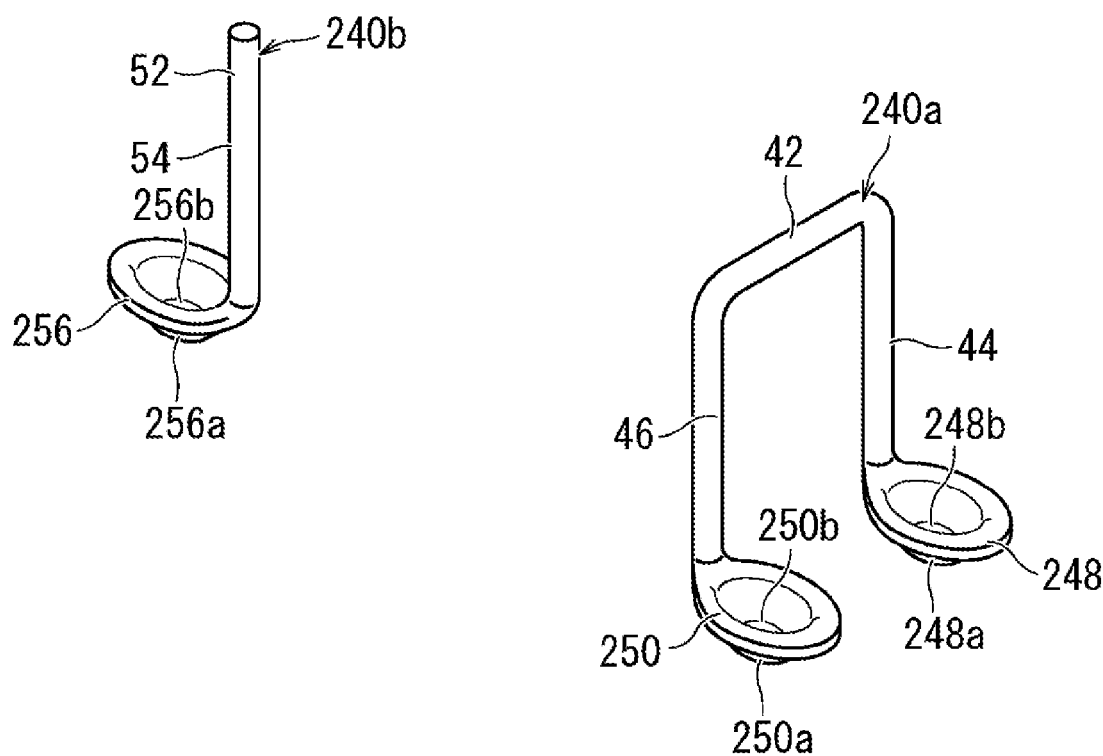
FIG. 13 is an external perspective view showing a metal terminal included in the multilayer ceramic electronic component according to the third preferred embodiment of the present invention.
Figure 14:
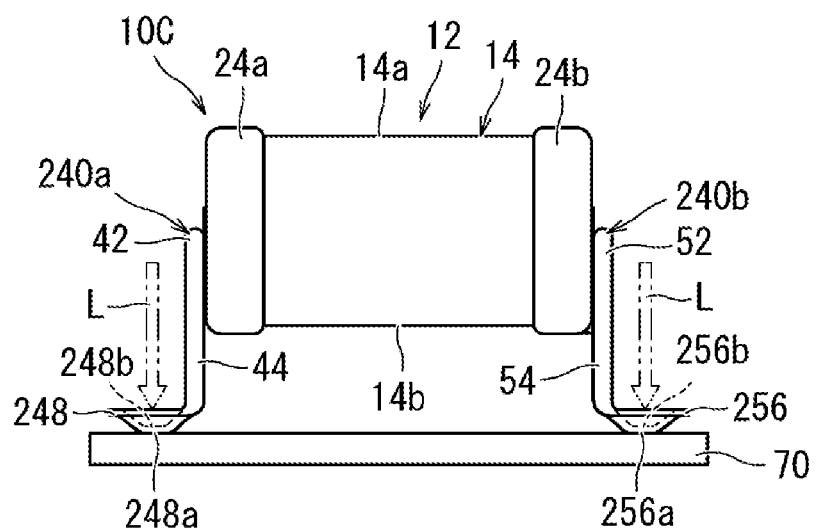
FIG. 14 is a schematic configuration diagram showing a state of a mounting structure of the multilayer ceramic electronic component according to the third preferred embodiment of the present invention.

A multilayer ceramic electronic component according to a third preferred embodiment of the present invention will be described. FIG. 11 is an external perspective view showing an example of the multilayer ceramic electronic component according to the third preferred embodiment of the present invention. FIG. 12 is a cross-sectional view taken along line XII-XII of FIG. 11 showing the multilayer ceramic electronic component according to the third preferred embodiment of the present invention. FIG. 13 is an external perspective view showing a metal terminal included in the multilayer ceramic electronic component according to the third preferred embodiment of the present invention. FIG. 14 is a schematic configuration diagram showing a state of a mounting structure of the multilayer ceramic electronic component according to the third preferred embodiment of the present invention.

A multilayer ceramic electronic component 10C according to the third preferred embodiment has the same or substantially the same configuration as that of the multilayer ceramic electronic component 10A described using FIG. 1, except that the configuration of a first mounting portion 248 and a second mounting portion 250 of a first metal terminal 240a and a third mounting portion 256 of a second metal terminal 240b is different from the configuration of the first mounting portion 48 and the second mounting portion 50 of the first metal terminal 40a and the third mounting portion of the second metal terminal 40b of the first preferred embodiment. Accordingly, the same elements and features as those of the multilayer ceramic electronic component 10A shown in FIG. are denoted by the same reference numerals, and description thereof is omitted.

As shown in FIG. 13, the first metal terminal 240a and the second metal terminal 240b included in the multilayer ceramic electronic component 10C shown in FIG. 11 are provided such that the first mounting portion 248 and the second mounting portion 250 of the first metal terminal 240a and the third mounting portion 256 of the second metal terminal 240b have an elliptical or substantially elliptical shape.

That is, the first mounting portion 248 of the first metal terminal 240a is sufficiently pressed and crushed into an elliptical or substantially elliptical shape and includes at its central portion an elliptical or substantially elliptical first protrusion bending portion 248a protruding toward the mounting surface of the mounting substrate. A recess on the side opposite to the mounting surface side of the mounting substrate in the first protrusion bending portion 248a is defined as an elliptical or substantially elliptical first recess bending portion 248b.

The second mounting portion 250 of the first metal terminal 240a is sufficiently pressed and crushed into an elliptical or substantially elliptical shape and includes at its central portion an elliptical or substantially elliptical second protrusion bending portion 250a protruding toward the mounting surface of the mounting substrate. A recess on the side opposite to the mounting surface side of the mounting substrate in the second protrusion bending portion 250a is defined as an elliptical or substantially elliptical second recess bending portion 250b.

The third mounting portion 256 of the second metal terminal 240b is sufficiently pressed and crushed into an elliptical or substantially elliptical shape and includes at its central portion an elliptical or substantially elliptical third protrusion bending portion 256a protruding toward the mounting surface of the mounting substrate. A recess on the side opposite to the mounting surface side of the mounting substrate in the third protrusion bending portion 256a is defined as an elliptical or substantially elliptical third recess bending portion 256b.

The respective apexes of the first protrusion bending portion 248a, the second protrusion bending portion 250a, and the third protrusion bending portion 256a protruding toward the mounting surface of the mounting substrate are disposed to be in contact with the mounting surface of the mounting substrate. At this time, the first protrusion bending portion 248a, the second protrusion bending portion 250a, and the third protrusion bending portion 256a are disposed so as not to be positioned on a straight line. According to the present preferred embodiment, with such a configuration, it is possible to provide a configuration in which the protrusion bending portions are in surface contact with the mounting surface of the mounting substrate at three positions with small areas. Consequently, even if the mounting substrate warps, or a connection portion is not disposed in a single plane due to a step difference, it is possible to achieve a state in which the mounting surface reliably contacts at three positions, and to reliably perform mounting by welding.

Since the first mounting portion 248 and the second mounting portion 250 of the first metal terminal 240a and the third mounting portion 256 of the second metal terminal 240b are in surface contact with the mounting substrate, the contact area with the mounting substrate slightly increases as compared to the second preferred embodiment. Consequently, the joining strength between the first, second, and third protrusion bending portions 248a, 250a, and 256a and the mounting surface of the mounting substrate is improved, and the multilayer ceramic electronic component 10C is unlikely to detach or drop from the mounting substrate.

Next, a preferred embodiment of a method of manufacturing a multilayer ceramic electronic component having the above configurations will be described, referring to the multilayer ceramic electronic component 10A as an example.

First, a ceramic green sheet, a conductive paste for internal electrodes for forming the internal electrode layer 18, and a conductive paste for external electrodes for forming the external electrode 24 are prepared. Although the ceramic green sheet, the conductive paste for internal electrodes, and the conductive paste for external electrodes include an organic binder and a solvent, known organic binder and organic solvent may be used.

Then, the conductive paste for internal electrodes is printed on the ceramic green sheet in a predetermined pattern, for example, and an internal electrode pattern is formed on the ceramic green sheet. The conductive paste for internal electrodes can be printed by a known method such as screen printing or gravure printing.

Then, a predetermined number of ceramic green sheets for outer layers on which the internal electrode pattern is not printed are stacked, ceramic green sheets on which the internal electrode pattern is printed is sequentially stacked thereon, and a predetermined number of the ceramic green sheets for outer layers are stacked thereon, thus producing a laminate sheet. Subsequently, this laminate sheet is pressure-bonded in the stacking direction x by, for example, isostatic pressing to produce a laminate block.

Thereafter, the laminate block is cut out in a predetermined shape and dimension to cut out a raw laminate chip. At this time, corner portions or ridge portions of the raw laminate may be rounded by barrel polishing or other suitable method, for example. Subsequently, the raw laminate chip that is cut out is fired to produce the laminate 14. Although a firing temperature of the raw laminate chip depends on a ceramic material or a material of the conductive paste for internal electrodes, the firing temperature is preferably not less than about 900° C. and not more than about 1300° C., for example.

Then, in order to form a baking layer of the external electrode 24, for example, the conductive paste for external electrodes is applied to an exposed portion of the first extended electrode portion 20a of the first internal electrode layer 18a exposed from the first end surface 14e in the surface of the laminate 14, and is baked, and similarly, in order to form the baking layer of the external electrode 24, for example, the conductive paste for external electrodes is applied to an exposed portion of the second extended electrode portion 20b of the second internal electrode layer 18b exposed from the second end surface 14f of the laminate 14, and is baked, thus forming the baking layer. The baking temperature at this time is preferably not less than about 700° C. and not more than about 900° C., for example. If necessary, one or more plating layers are formed on the surface of the baking layer, the external electrode 24 is formed, and the electronic component body 12 is manufactured.

Instead of forming a baking layer as the external electrode 24, plating treatment may be applied to a portion on the side of the first end surface 14e of the surface of the laminate 14, and a base plating film may be formed at an exposed portion of the first extended electrode portion 20a of the first internal electrode layer 18a exposed from the first end surface 14e. Similarly, plating treatment may be applied to a portion on the side of the second end surface 14f of the surface of the laminate 14, and a base plating film may be formed at an exposed portion of the second extended electrode portion 20b of the second internal electrode layer 18b exposed from the second end surface 14f.

Although either electrolytic plating or electroless plating may be used as the plating treatment, when electroless plating is used, a pretreatment using a catalyst is required so as to increase a plating deposition rate. Thus, there is a disadvantage that the process becomes complicated. Accordingly, it is preferable to use electrolytic plating. As the plating method, barrel plating is preferably used.

When a portion of the conductor of the external electrode 24 is formed on the first main surface 14a and the second main surface 14b of the laminate 14, a surface conductor pattern is previously printed on the outermost ceramic green sheet and then may be fired simultaneously with the laminate 14, or a surface conductor may be printed on the first main surface 14a and the second main surface 14b of the fired laminate 14 and then baked. If necessary, an upper plating layer is formed on the surface of the base plating film.

Thus, plating electrodes are formed directly on the first end surface 14e and the second end surface 14f of the laminate 14.

Subsequently, a process of attaching a metal terminal in the method of manufacturing the multilayer ceramic electronic component according to the present preferred embodiment will be described.

First, the first metal terminal 40a and the second metal terminal 40b are prepared.

Then, the first joining material (solder) 60a is applied onto the surface of the first external electrode 24a of the first end surface 14e of the electronic component body 12 or the surface of the first terminal joining portion 42 of the prepared first metal terminal 40a. Thereafter, the first external electrode 24a of the electronic component body 12 and the first terminal joining portion 42 of the first metal terminal 40a are reflowed in a state of being joined, such that the first metal terminal 40a is attached to the first external electrode 24a of the electronic component body 12. Similarly, the second joining material (solder) 60b is applied onto the surface of the second external electrode 24b of the second end surface 14f of the electronic component body 12 or the surface of the second terminal joining portion 52 of the prepared second metal terminal 40b. Thereafter, the second external electrode 24b of the electronic component body 12 and the second terminal joining portion 52 of the second metal terminal 40b are reflowed in a state of being joined, such that the second metal terminal 40b is attached to the second external electrode 24b of the electronic component body 12.

As described above, the multilayer ceramic electronic component 10A shown in FIG. 1 is manufactured.

The present invention is not limited to the above-described preferred embodiments, and may be modified in various ways without departing from the scope of the present invention. The thickness of the ceramic layer of the electronic component body, the number of layers, the stacking direction, the counter electrode area, and the external dimensions are not limited thereto. In the multilayer ceramic electronic components 10A, 10B, and 10C according to the preferred embodiments described above, only one electronic component body 12 is included, but the present invention is not limited thereto. The electronic component bodies 12 may be stacked in two or more stages.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
a laminate including a plurality of ceramic layers and a plurality of internal electrode layers, which are alternately stacked, a first main surface and a second main surface facing each other in a stacking direction, a first side surface and a second side surface facing each other in a width direction orthogonal or substantially orthogonal to the stacking direction, and a first end surface and a second end surface facing each other in a length direction orthogonal or substantially orthogonal to the stacking direction and the width direction;
an electronic component body including a first external electrode connected to the first end surface of the laminate and a second external electrode connected to the second end surface of the laminate;
a first metal terminal connected to the first external electrode; and
a second metal terminal connected to the second external electrode; wherein
the second main surface of the laminate is located on a side of a mounting surface of a mounting substrate on which the multilayer ceramic electronic component is to be mounted; the first metal terminal includes:
a first terminal joining portion that is defined by a lead wire, extends in a width direction connecting the first side surface and the second side surface, and is connected to the first end surface;
a first extending portion and a second extending portion that extend from both ends of the first terminal joining portion and extend toward the mounting surface such that a gap is defined between the second main surface of the multilayer ceramic electronic component and the mounting surface of the mounting substrate;
a first mounting portion that is connected to the first extending portion and extends in a length direction connecting the first end surface and the second end surface; and
a second mounting portion that is connected to the second extending portion and extends in the length direction connecting the first end surface and the second end surface;
the second metal terminal includes:
a second terminal joining portion that is defined by a lead wire and connected to the second end surface;
a third extending portion that is connected to the second terminal joining portion and extends toward the mounting surface such that a gap is defined between the second main surface of the multilayer ceramic electronic component and the mounting surface of the mounting substrate; and
a third mounting portion that is connected to the third extending portion and extends in the length direction connecting the first end surface and the second end surface;
the first mounting portion includes a first protrusion bending portion protruding toward the mounting surface of the mounting substrate;
the second mounting portion includes a second protrusion bending portion protruding toward the mounting surface of the mounting substrate;
the third mounting portion includes a third protrusion bending portion protruding toward the mounting surface of the mounting substrate; and
respective apexes of the first, second, and third protrusion bending portions are disposed in contact with the mounting surface of the mounting substrate.

2. The multilayer ceramic electronic component according to claim 1, wherein a height of the first, second, and third protrusion bending portions is not less than about 0.1 mm and not more than about 1 mm.

3. The multilayer ceramic electronic component according to claim 1, wherein surfaces of the first and second metal terminals include a black color or an oxidized coating.

4. The multilayer ceramic electronic component according to claim 1, wherein each of the first, second, and third mounting portions has a rectangular or substantially rectangular shape.

5. The multilayer ceramic electronic component according to claim 1, wherein each of the first, second, and third protrusion bending portions has a linear shape.

6. The multilayer ceramic electronic component according to claim 1, wherein each of the first and second metal terminals includes a terminal body and a plating film provided on a surface of the terminal body.

7. The multilayer ceramic electronic component according to claim 6, wherein the terminal body is made of Ni, Fe, Cu, Cr, or an alloy primarily including one or more of Ni, Fe, Cu, or Cr.

8. The multilayer ceramic electronic component according to claim 6, wherein the plating film includes an upper plating layer and a lower plating layer.

9. The multilayer ceramic electronic component according to claim 1, wherein a diameter of each of the first and second metal terminals is not less than about 0.4 mm and not more than about 0.8 mm.

10. A mounting structure of a multilayer ceramic electronic component comprising:
a laminate including a plurality of ceramic layers and a plurality of internal electrode layers, which are alternately stacked, a first main surface and a second main surface facing each other in a stacking direction, a first side surface and a second side surface facing each other in a width direction orthogonal or substantially orthogonal to the stacking direction, and a first end surface and a second end surface facing each other in a length direction orthogonal or substantially orthogonal to the stacking direction and the width direction;
an electronic component body including a first external electrode connected to the first end surface of the laminate and a second external electrode connected to the second end surface of the laminate;
a first metal terminal connected to the first external electrode; and
a second metal terminal connected to the second external electrode; wherein
the second main surface of the laminate is located on a side of a mounting surface of a mounting substrate on which the multilayer ceramic electronic component is mounted;
the first metal terminal includes:
a first terminal joining portion that is defined by a lead wire, extends in a width direction connecting the first side surface and the second side surface, and is connected to the first end surface;
a first extending portion and a second extending portion that extend from both ends of the first terminal joining portion and extend toward the mounting surface such that a gap is defined between the second main surface of the multilayer ceramic electronic component and the mounting surface of the mounting substrate;
a first mounting portion that is connected to the first extending portion and extends in a length direction connecting the first end surface and the second end surface; and
a second mounting portion that is connected to the second extending portion and extends in the length direction connecting the first end surface and the second end surface,
the second metal terminal includes:
a second terminal joining portion that is defined by a lead wire and connected to the second end surface;
a third extending portion that is connected to the second terminal joining portion and extends toward the mounting surface such that a gap is defined between the second main surface of the multilayer ceramic electronic component and the mounting surface of the mounting substrate; and
a third mounting portion that is connected to the third extending portion and extends in the length direction connecting the first end surface and the second end surface;
the first mounting portion includes a first protrusion bending portion protruding toward the mounting surface of the mounting substrate;
the second mounting portion includes a second protrusion bending portion protruding toward the mounting surface of the mounting substrate;
the third mounting portion includes a third protrusion bending portion protruding toward the mounting surface of the mounting substrate;
respective apexes of the first, second, and third protrusion bending portions are joined to the mounting surface of the mounting substrate; and
the multilayer ceramic electronic component is joined to the mounting surface of the mounting substrate by welding from a first recess bending portion on an opposite side to the mounting surface of the mounting substrate at the position of the first protrusion bending portion,
joined to the mounting surface of the mounting substrate by welding from a second recess bending portion on the opposite side to the mounting surface of the mounting substrate at the position of the second protrusion bending portion, and
joined to the mounting surface of the mounting substrate by welding from a third recess bending portion on the opposite side to the mounting surface of the mounting substrate at the position of the third protrusion bending portion.

11. The mounting structure of the multilayer ceramic electronic component according to claim 10, wherein in the joining by welding, the first, second, and third recess bending portions are irradiated with laser, and the multilayer ceramic electronic component is joined by laser welding.

12. The mounting structure of the multilayer ceramic electronic component according to claim 10, wherein a height of the first, second, and third protrusion bending portions is not less than about 0.1 mm and not more than about 1 mm.

13. The mounting structure of the multilayer ceramic electronic component according to claim 10, wherein surfaces of the first and second metal terminals include a black color or an oxidized coating.

14. The mounting structure of the multilayer ceramic electronic component according to claim 10, wherein each of the first, second, and third mounting portions has a rectangular or substantially rectangular shape.

15. The mounting structure of the multilayer ceramic electronic component according to claim 10, wherein each of the first, second, and third protrusion bending portions has a linear shape.

16. The mounting structure of the multilayer ceramic electronic component according to claim 10, wherein each of the first and second metal terminals includes a terminal body and a plating film provided on a surface of the terminal body.

17. The mounting structure of the multilayer ceramic electronic component according to claim 16, wherein the terminal body is made of Ni, Fe, Cu, Cr, or an alloy primarily including one or more of Ni, Fe, Cu, or Cr.

18. The mounting structure of the multilayer ceramic electronic component according to claim 16, wherein the plating film includes an upper plating layer and a lower plating layer.

19. The mounting structure of the multilayer ceramic electronic component according to claim 10, wherein a diameter of each of the first and second metal terminals is not less than about 0.4 mm and not more than about 0.8 mm.

* * * * *